US010002873B2

(12) United States Patent
Hong et al.

(10) Patent No.: US 10,002,873 B2
(45) Date of Patent: Jun. 19, 2018

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Hyun Sil Hong, Hwaseong-si (KR); Seong Mo Koo, Seoul (KR)

(73) Assignee: SAMSUNG ELECTRONICS CO., LTD., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/616,471

(22) Filed: Jun. 7, 2017

(65) Prior Publication Data
US 2018/0026040 A1  Jan. 25, 2018

(30) Foreign Application Priority Data
Jul. 25, 2016  (KR) .................. 10-2016-0094020

(51) Int. Cl.
*H01L 27/108* (2006.01)
*H01L 21/283* (2006.01)
*H01L 21/311* (2006.01)

(52) U.S. Cl.
CPC ...... *H01L 27/10844* (2013.01); *H01L 21/283* (2013.01); *H01L 21/31111* (2013.01); *H01L 21/31116* (2013.01)

(58) Field of Classification Search
CPC ......... H01L 21/31111; H01L 21/31116; H01L 27/10844
See application file for complete search history.

(56) References Cited

U.S. PATENT DOCUMENTS

| 4,726,790 | A | 2/1988 | Hadjis |
|---|---|---|---|
| 6,270,835 | B1 | 8/2001 | Hunt et al. |
| 6,477,035 | B1 | 11/2002 | Cepas et al. |
| 6,984,874 | B2 | 1/2006 | Givens et al. |
| 8,399,916 | B2 | 3/2013 | Kadoya |
| 8,734,656 | B2 | 5/2014 | Kiehlbauch |
| 8,748,283 | B2 | 6/2014 | Huang et al. |
| 8,822,302 | B2 | 9/2014 | Song et al. |
| 9,053,971 | B2 | 6/2015 | Park et al. |
| 2002/0079845 | A1 | 6/2002 | Kirkpatrick et al. |
| 2006/0128139 | A1 | 6/2006 | Paranjpe et al. |
| 2008/0045034 | A1* | 2/2008 | Shea ............... H01L 21/31116 438/738 |
| 2008/0062613 | A1 | 3/2008 | Wilson et al. |
| 2015/0041973 | A1* | 2/2015 | Park ..................... H01L 24/14 257/737 |
| 2015/0279842 | A1* | 10/2015 | Komeda ........... H01L 27/10814 257/532 |

\* cited by examiner

*Primary Examiner* — Mounir Amer
(74) *Attorney, Agent, or Firm* — Lee & Morse, P.C.

(57) ABSTRACT

A method of manufacturing a semiconductor device includes stacking a molding layer and a preliminary support layer on a substrate, forming a support layer having a plurality of openings by removing at least a portion of the preliminary support layer, forming a sacrificial layer by filling the plurality of openings with a different material from a material of the molding layer and from a material of the preliminary support layer, forming a plurality of vertical holes through the support layer and through the molding layer, forming a lower electrode within the plurality of vertical holes, and removing the sacrificial layer and the molding layer.

20 Claims, 30 Drawing Sheets

METHOD OF MANUFACTURING SEMICONDUCTOR DEVICE

CROSS-REFERENCE TO RELATED APPLICATION

Korean Patent Application No. 10-2016-0094020, filed on Jul. 25, 2016, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device.

2. Description of the Related Art

For a semiconductor device, e.g., a dynamic random-access memory (DRAM), a trend is to suggest various methods for reducing an area in which a device is located and maintaining or increasing electrostatic capacity at the same time, by increasing a degree of integration. A method of increasing a height of a capacitor has been widely adopted to increase electrostatic capacity without a decrease of degree of integration, and one or a plurality of support layers may be used to stably form a high capacitor.

SUMMARY

According to an aspect of embodiments, a method of manufacturing a semiconductor device may include sequentially stacking a molding layer and a preliminary support layer on a substrate, forming a support layer having a plurality of openings by removing at least a portion of the preliminary support layer, forming a sacrificial layer by filling the plurality of openings with a different material from that of the molding layer and the preliminary support layer, forming a plurality of vertical holes passing through the support layer and the molding layer, forming a lower electrode within the plurality of vertical holes; and removing the sacrificial layer and the molding layer.

According to an aspect of embodiments, a method of manufacturing a semiconductor device may include alternately stacking a plurality of support layers having a plurality of openings and a plurality of sacrificial layers provided within the plurality of openings, and a plurality of molding layers on a substrate, forming a plurality of vertical holes passing through the plurality of support layers and the plurality of molding layers, forming a lower electrode layer within the plurality of vertical holes, removing the plurality of sacrificial layers included in the plurality of support layers and the plurality of molding layers, and sequentially forming a dielectric layer and an upper electrode on the lower electrode.

According to an aspect of embodiments, a method of manufacturing a semiconductor device may include stacking a molding layer and a preliminary support layer on a substrate, forming a support layer having a plurality of openings by removing at least a portion of the preliminary support layer, forming a sacrificial layer by filling the plurality of openings in the support layer with a different material from a material of the molding layer and from a material of the preliminary support layer, dry etching rate of the materials of the sacrificial layer and of the support layer being similar, forming a plurality of vertical holes through the support layer and through the molding layer by dry etching the support layer and the molding layer, forming a lower electrode within the plurality of vertical holes, and removing the sacrificial layer and the molding layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
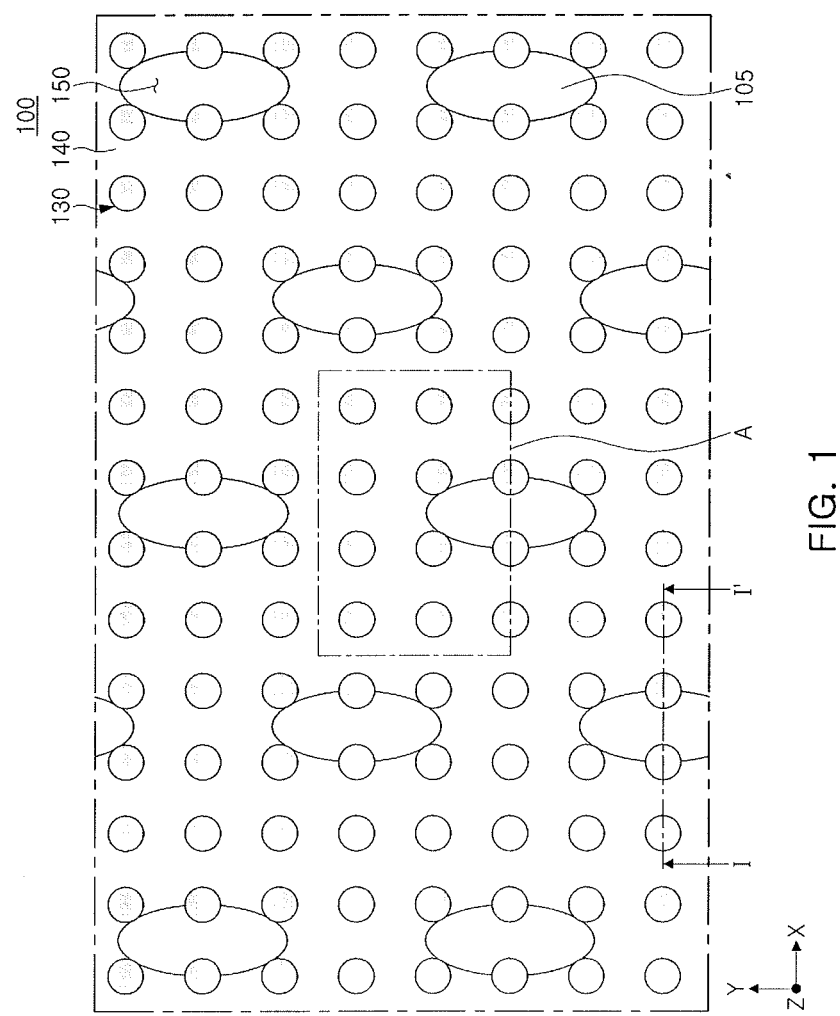
FIG. 1 illustrates a plan view of a semiconductor device according to an example embodiment.

FIG. 1 is a plan view illustrating a semiconductor device according to an example embodiment. The semiconductor device in FIG. 1 may be, e.g., a Dynamic Random Access Memory (DRAM), and may be a cell array region of a DRAM, but is not limited thereto.

With reference to FIG. 1, a semiconductor device according to an example embodiment may include a support layer 140 and a plurality of vertical capacitors 130 formed to pass through the support layer 140. The plurality of vertical capacitors 130 may be provided for the purpose of writing data by storing a charge. To increase a degree of integration of a DRAM, a vertical capacitor 130 extended in a direction perpendicular to an upper surface of a substrate may be provided. In addition, as a height of the vertical capacitor 130 is increased, capacity of the vertical capacitor 130 may be increased.

The support layer 140 may be a structure provided to prevent bending or collapsing of the vertical capacitor 130, e.g., due to an increase in a height of the vertical capacitor 130. The support layer 140 may have a plurality of openings 150, and at least a portion of the plurality of vertical capacitors 130 may be disposed to be adjacent to an opening 150. In an example embodiment illustrated in FIG. 1, the opening 150 is illustrated to have an elliptical shape, but may have various shapes other than the elliptical shape. In an example embodiment, the plurality of openings 150 may be disposed regularly on an upper surface (an X-Y plane in FIG. 1) of the support layer 140.

Figure 2:
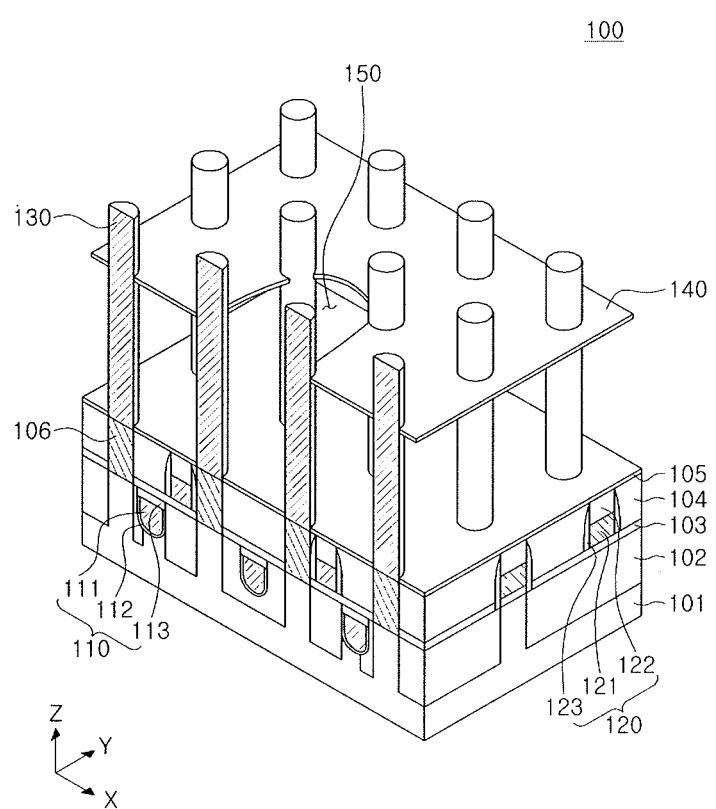
FIG. 2 illustrates a perspective view of portion A in FIG. 1.

FIG. 2 is a perspective view illustrating portion A of the semiconductor device in FIG. 1.

With reference to FIG. 2, a semiconductor device 100, according to an example embodiment may include a substrate 101, a gate structure 110 formed within the substrate 101, a bit line structure 120, the vertical capacitor 130, the support layer 140, and the like. The substrate 101 may include a semiconductor material, e.g., silicon, germanium, silicon-germanium or the like, and a device isolation film 102 for defining an active region may be provided on the substrate 101.

The gate structure 110 may be extended in a first direction, e.g., in a Y-axis direction of FIG. 2. The gate structure 110 may be extended in the first direction to cross an active region and the device isolation film 102 provided on the substrate 101. The gate structure 110 may be provided as a plurality of gate structures in a second direction (an X-axis direction in FIG. 2) intersecting the first direction.

In an example embodiment, the gate structure 110 may be a word line configuring a buried channel array transistor (BCAT). The gate structure 110 may include a gate electrode 111, a gate insulating layer 112, a capping layer 113, and the like. In an example embodiment, an upper surface of the capping layer 113 may be at a same level as an upper surface of the substrate 101 to be co-planar therewith. Thus, the gate electrode 111 may be provided below an upper surface of the substrate 101. A shape of the gate structure 110 is not limited to that illustrated in FIG. 2, and may be provided above the substrate 101.

The bit line structure 120 may be extended in the second direction (the X-axis direction in FIG. 2). In other words, a direction in which the bit line structure 120 is extended may intersect a direction in which the gate structure 110 is extended. The bit line structure 120 may be provided as a plurality of bit line structures in the first direction (the Y-axis direction in FIG. 2) intersecting the second direction, and may be formed above the substrate 101. A shape of the bit line structure 120 is not limited to that illustrated in FIG. 2, and the bit line structure 120 may be embedded in the substrate 101. When the bit line structure 120 is embedded in the substrate 101, the bit line structure 120 may cross the active region and the device isolation film 102, provided on the substrate 101.

The bit line structure 120 may be disposed within an interlayer insulating film 104 provided above the substrate 101, and may include a bit line 121, a mask layer 122, spacers 123, and the like. The bit line structure 120 may pass through a cell blocking layer 103 to be electrically connected to the active region of the substrate 101. In this case, an active region of the substrate 101, connected to the bit line structure 120, may be a source/drain region adjacent to the gate structure 110.

An etch stop layer 105 may be provided above the bit line structure 120 and the interlayer insulating film 104. The etch stop layer 105 may be formed of a different material from that of the interlayer insulating film 104. In an example embodiment, the etch stop layer 105 may include, e.g., a silicon nitride, and the interlayer insulating film 104 may include, e.g., a silicon oxide. The cell blocking layer 103 provided below the interlayer insulating film 104 may include, e.g., a silicon oxide, a silicon nitride, a silicon oxynitride, or the like.

A plurality of contact pads 106 may be provided within the interlayer insulating film 104. A contact pad 106 may include a conductive material, and may pass through the interlayer insulating film 104 to allow the vertical capacitor 130 to be electrically connected to the substrate 101. With reference to FIG. 2, a lower portion of the contact pad 106 may be connected to the substrate 101 and an upper portion thereof may be connected to the vertical capacitor 130. In an example embodiment, the contact pad 106 may be connected to a source/drain region formed by the substrate 101. The source/drain region connected to the contact pad 106 may be a different region from a source/drain region connected to the bit line structure 120.

The vertical capacitor 130 may be extended in a direction, e.g., in a Z-axis direction in FIG. 2, perpendicular to an upper surface (an X-Y plane in FIG. 2) of the substrate 101, and may be connected to an active region of the substrate 101 through the contact pad 106. The vertical capacitor 130 may include an upper electrode, a lower electrode, and a dielectric layer disposed therebetween, and capacity of the vertical capacitor 130 may be determined according to a dielectric constant of the dielectric layer, a height of the vertical capacitor 130, or the like. In a process in which the vertical capacitor 130 having a sufficient height is formed, the support layer 140 may be provided to prevent the vertical capacitor 130 from collapsing or being tilted.

The support layer 140 may have a surface parallel to an upper surface of the substrate 101, and may have the plurality of openings 150. A shape, an area, or the like of the opening 150 may be variously changed, and at least a portion of the plurality of vertical capacitors 130 may be disposed to be adjacent to the opening 150. Hereinafter, a structure of the vertical capacitor 130 will be described with reference to FIG. 3 in more detail.

Figure 3:
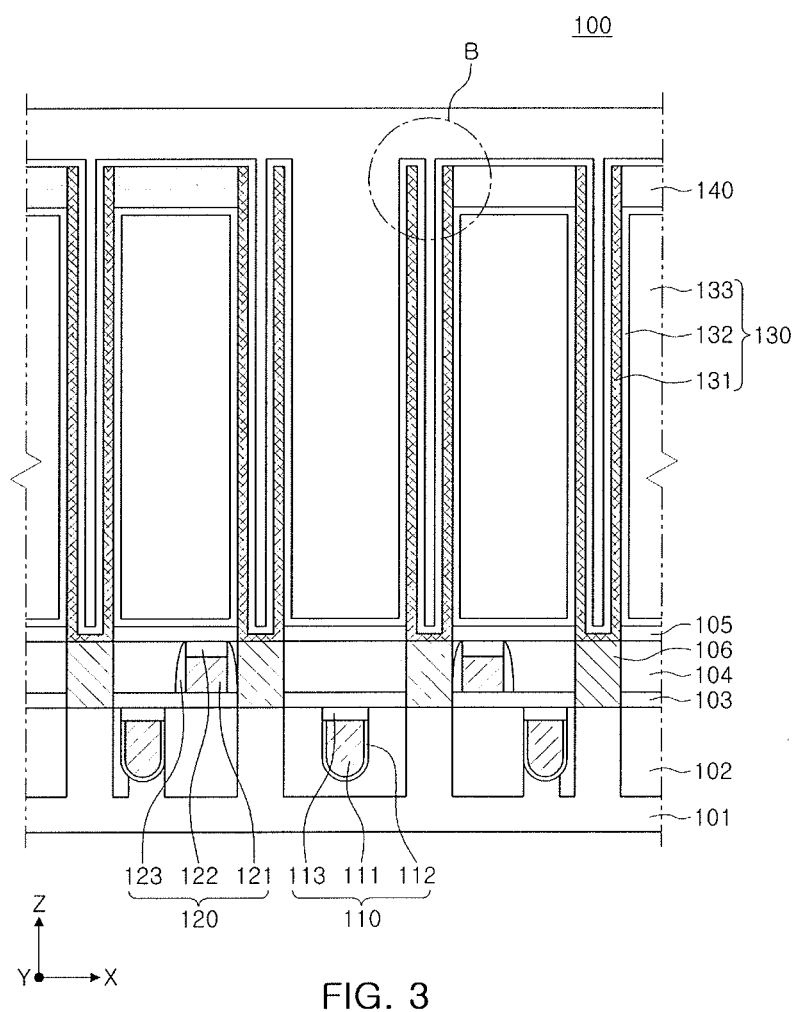
FIG. 3 illustrates a cross section taken along line I-I' of FIG. 1.

FIG. 3 is a drawing illustrating a cross section of the semiconductor device in FIG. 1 taken along line I-I'. Hereinafter, descriptions of any components previously described with reference to FIG. 2 will be omitted.

With reference to FIG. 3, in the semiconductor device 100 according to an example embodiment, the vertical capacitor 130 may include a lower electrode 131, a dielectric layer 132, an upper electrode 133, and the like. The lower electrode 131 may have a cylindrical shape of which an inside is empty, and a lower surface of the lower electrode 131 may be in contact with an upper surface of the contact pad 106. Besides having a cylindrical shape, the lower electrode 131 may also have a columnar shape, of which an inside is filled. The lower electrode 131 may be formed of at least one of, e.g., doped polysilicon, tungsten, titanium or the like, a metal oxide, a metal nitride, and combinations thereof.

The dielectric layer 132 may be Ruined on the lower electrode 131, and may include a high dielectric constant material, e.g., a zirconium dioxide ($ZrO_2$), an aluminum oxide ($Al_2O_3$), a hafnium oxide ($Hf_2O_3$), or the like. The upper electrode 133 is formed on the dielectric layer 132, and the upper electrode 133 may fill an entirety of interspaces of the dielectric layer 132 and may be formed above the support layer 140. The upper electrode 133 may be formed of at least one of a semiconductor material, e.g., doped polysilicon, silicon, germanium, silicon-germanium or the like, a metal, e.g., tungsten, titanium or the like, a metal oxide, a metal nitride, or combinations thereof. In addition, the upper electrode 133 may include a plurality of layers. When the upper electrode 133 includes three layers sequentially stacked from the dielectric layer 132, the three layers may include a metal nitride, a semiconductor material, and a metal, in this order.

Figure 4:
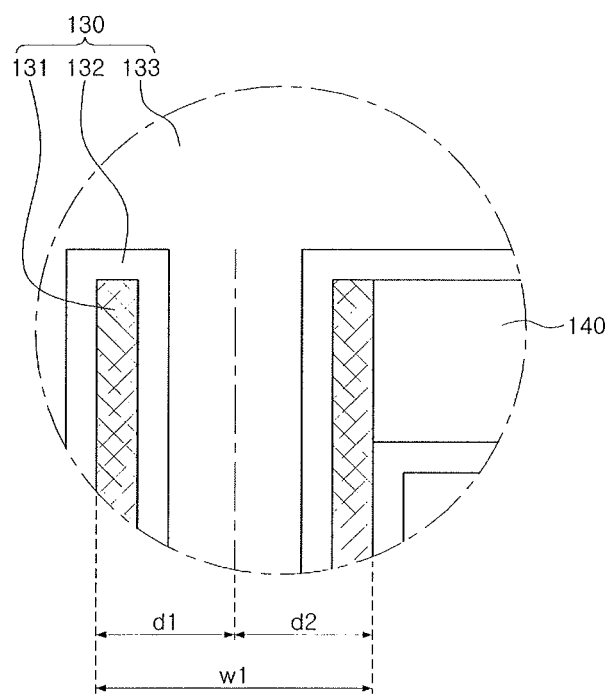
FIG. 4 illustrates an enlarged view of portion B in FIG. 3.

FIG. 4 is a drawing illustrating enlarged portion B in FIG. 3.

With reference to FIGS. 3-4, the vertical capacitor 130 may include the lower electrode 131, the dielectric layer 132, and the upper electrode 133, while the support layer 140 for preventing the vertical capacitor 130 from being tilted, collapsing or the like may be provided between adjacent vertical capacitors 130. A molding layer and the support layer 140 are formed on the etch stop layer 105, a vertical hole passing through the molding layer and the support layer 140 is formed, and the lower electrode 131 is formed therein, to form the vertical capacitor 130. In a subsequent process, the molding layer is removed. To prevent the lower electrode 131 from being tilted, collapsing or the like, while the molding layer is removed, the vertical hole for formation of the lower electrode 131 is required to have excellent symmetric properties.

As described previously, at least a portion of the plurality of vertical capacitors 130 may be formed to be adjacent to the opening 150. In a process of forming the vertical hole, the opening 150 is filled with a predetermined material and, if the predetermined material in the opening 150 were to have different etching characteristics with respect to the material included in the support layer 140, the vertical hole could have an asymmetrical shape, thereby causing the lower electrode 131 or the vertical capacitor 130 to have an asymmetrical shape. As a result, reliability of the vertical capacitor 130 could be degraded.

Therefore, in an example embodiment, when the vertical hole is formed, a material filling the opening 150 is selected to allow the vertical hole to be formed to have a symmetrical shape. That is, as illustrated in FIG. 4, the lower electrode 131 according to embodiments may have a symmetrical shape, based on a center line in a cross section. For example, as illustrated in FIG. 4, distances d1 and d2 to both inner walls, based on a center line in a cross section of the vertical capacitor 130, may be substantially equal to each other. In addition, a cross sectional diameter w1 of the vertical capacitor 130 may substantially equal twice d1 or twice d2.

In detail, the material filling the opening 150 may have etching characteristics, e.g., an etching rate, similar to that of the support layer 140 in a process of forming the vertical hole, e.g., via dry etching, and may have etching characteristics similar to those of the molding layer in a subsequent process for removing the molding layer, e.g., via wet etching. In an example embodiment, when the support layer 140 includes a silicon nitride or a silicon carbon nitride, and the molding layer includes a silicon oxide, the opening 150 may be filled with a silicon oxynitride. In this case, when the opening 150 is filled with a silicon oxynitride, an amount of ammonia used as a source gas may be appropriately adjusted to adjust etching characteristics of the material filling the opening 150. Thus, without a substantial increase in the number of steps required in a process, the lower electrode 131 having a symmetrical structure may be effectively formed.

For example, when an aspect ratio of the vertical capacitor 130 is relatively large, the vertical capacitor 130 may have a tapered structure in which a width w1 thereof is gradually reduced toward the substrate 101, e.g., while still maintaining a symmetrical structure with respect to a central axis of the vertical capacitor 130. In another example, the vertical capacitor 130 may have a columnar structure in which a width w1 thereof is constant in a height direction (a Z-axis direction). Therefore, as illustrated in FIG. 4, the lower electrode 131 may have a symmetrical structure, based on a center line of a cross section, in a portion in which the support layer 140 is formed.

In detail, in an example embodiment, in a process of forming a vertical hole, the opening 150 may be filled with a material having, e.g., dry, etching characteristics similar to those of the support layer 140, so during formation of the vertical hole, substantially same amounts of both materials, i.e., material filling the opening 150 and material of the support layer 140, may be removed to form a symmetrical structure. Further, the materials of the support layer 140 and filling the opening 150 may have a different etching rate from that of the molding layer on an upper portion or a lower portion of the support layer 140 (e.g., a molding layer 160 in FIG. 10) when the vertical hole is formed. Thus, a portion of the vertical capacitor 130 adjacent to the support layer 140 may have a different width w1 from that of a portion of the vertical capacitor 130 located above or below the support layer 140 (e.g., FIG. 17). In an example embodiment, a portion of the vertical capacitor 130 adjacent to the support layer 140 may have a greater width than that of a portion of the vertical capacitor 130 located above or below the support layer 140.

Figure 5:
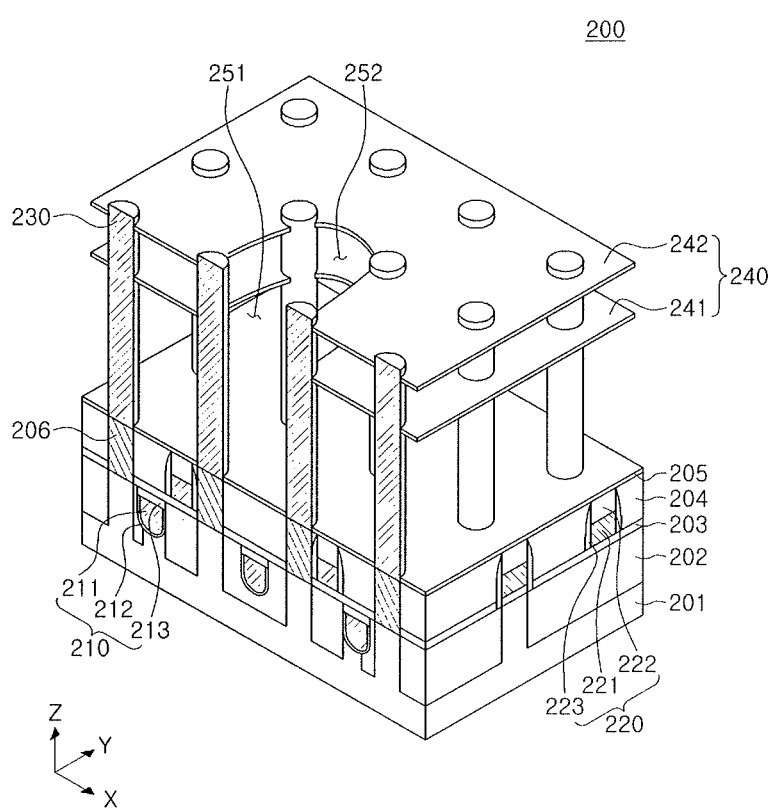
FIG. 5 illustrates a perspective view of a semiconductor device according to an example embodiment.

FIG. 5 is a perspective view illustrating a semiconductor device according to an example embodiment.

In a semiconductor device 200, according to an example embodiment illustrated in FIG. 5, a support layer 240 may include a first support layer 241 and a second support layer 242 vertically disposed. In a manner different from an example embodiment illustrated in FIG. 5, the support layer 240 may include three or more support layers. The first support layer 241 and the second support layer 242 may have a first opening 251 and a second opening 252, respectively, and the first opening 251 and the second opening 252 may be disposed in the same position in a vertical direction. In other words, the first opening 251 and the second opening 252 may overlap each other in a vertical direction.

The semiconductor device 200, according to an example embodiment illustrated in FIG. 5, may have a similar structure to that of the semiconductor device 100, according to an example embodiment illustrated in FIGS. 1 to 4. In other words, a gate structure 210 may be embedded in a substrate 201, and the gate structure 210 may include a gate electrode 211, a gate insulating layer 212, and a capping layer 213. A bit line structure 220 may be provided on a cell blocking layer 203 above the substrate 201, and may include a bit line 221, a mask layer 222, spacers 223, and the like.

The bit line structure 220 may be provided within an interlayer insulating film 204, and an etch stop layer 205 may be formed on the interlayer insulating film 204 and the bit line structure 220. A vertical capacitor 230 passes through the etch stop layer 205 to be connected to a contact pad 206, and the contact pad 206 may allow the vertical capacitor 230 to be connected to an active region of the substrate 201.

FIGS. 6 to 14 are drawings provided to describe a method of manufacturing a semiconductor device according to an example embodiment. The manufacturing method thereof described with reference to FIGS. 6 to 14 may be applied to the semiconductor device 100, according to an example embodiment illustrated in FIGS. 1 to 4.

Figure 6:
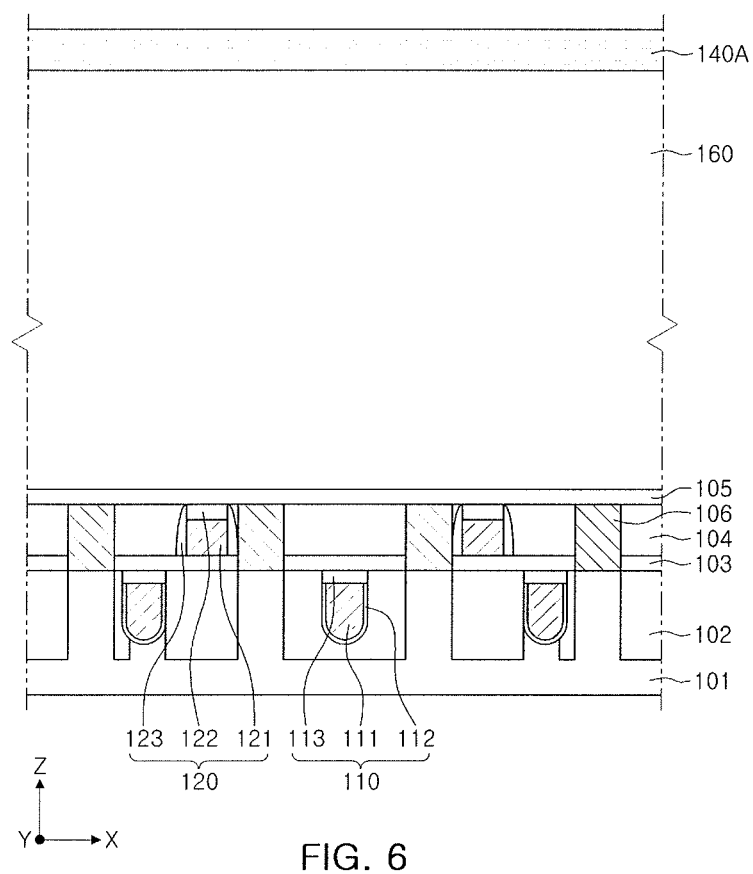
FIGS. 6 to 14 illustrate cross-sections of stages in a method of manufacturing a semiconductor device according to an example embodiment.

With reference to FIG. 6, the device isolation film 102, for defining an active region on an upper portion of the substrate 101, may be formed, and the gate structure 110 may be formed to pass through the active region and the device isolation film 102. The gate structure 110 may include the gate electrode 111, the gate insulating layer 112, the capping layer 113, and the like. Hereinafter, the cell blocking layer 103 may be formed on the substrate 101 and the device isolation film 102, and the bit line structure 120 may be formed above the cell blocking layer 103. The bit line structure 120 may be electrically connected to the active region of the substrate 101, and may include the bit line 121, the mask layer 122, the spacers 123, and the like. The cell blocking layer 103 may be formed of, e.g., a silicon oxide, a silicon nitride, a silicon oxynitride or the like.

The bit line structure 120 may be embedded in the interlayer insulating film 104. The interlayer insulating film 104 may be formed of, e.g., a silicon oxide, and the etch stop layer 105, which includes a silicon nitride, may be formed above the interlayer insulating film 104. The contact pad 106, in addition to the bit line structure 120 may be further formed within the interlayer insulating film 104, and the contact pad 106 may include a conductive material connected to the active region of the substrate 101.

A molding layer 160 and a preliminary support layer 140A may be formed above the etch stop layer 105. The molding layer 160 may be formed of a material having predetermined etch selectivity with respect to the etch stop layer 105. In an example embodiment, the molding layer 160 may be formed of a semiconductor oxide, e.g., a tetraethyl orthosilicate (TEOS) oxide, a High Density Plasma (HDP) oxide or the like, a semiconductor material or the like. The preliminary support layer 140A may be formed of a material having predetermined etch selectivity with respect to the molding layer 160. In an example embodiment, the preliminary support layer 140A may be formed of, e.g., a silicon nitride, a silicon carbon nitride or the like. The preliminary support layer 140A may have a smaller thickness than that of the molding layer 160.

Figure 7:
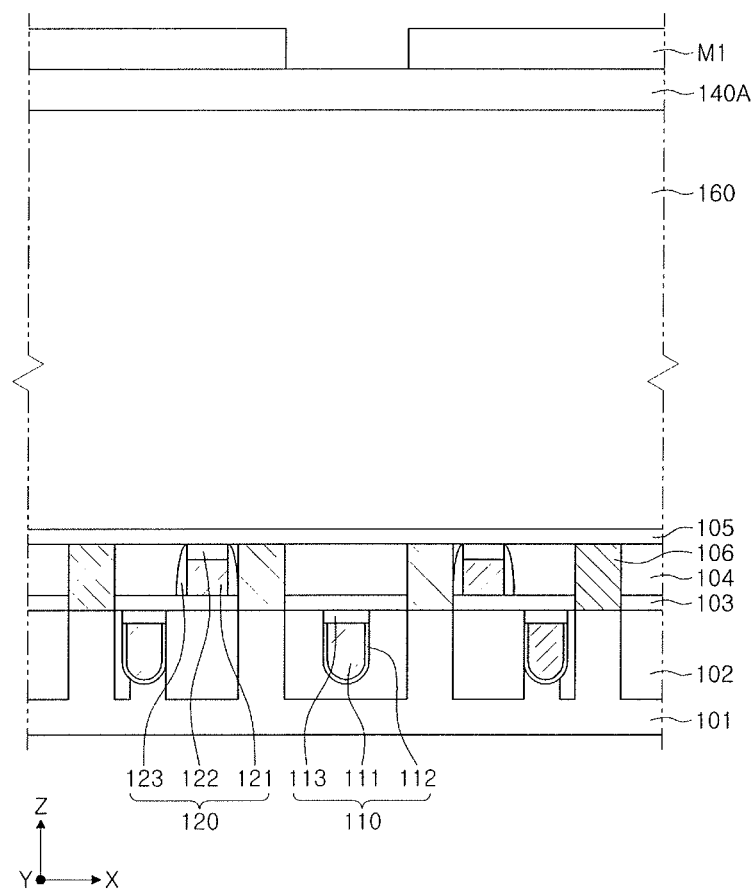
Figure 8:
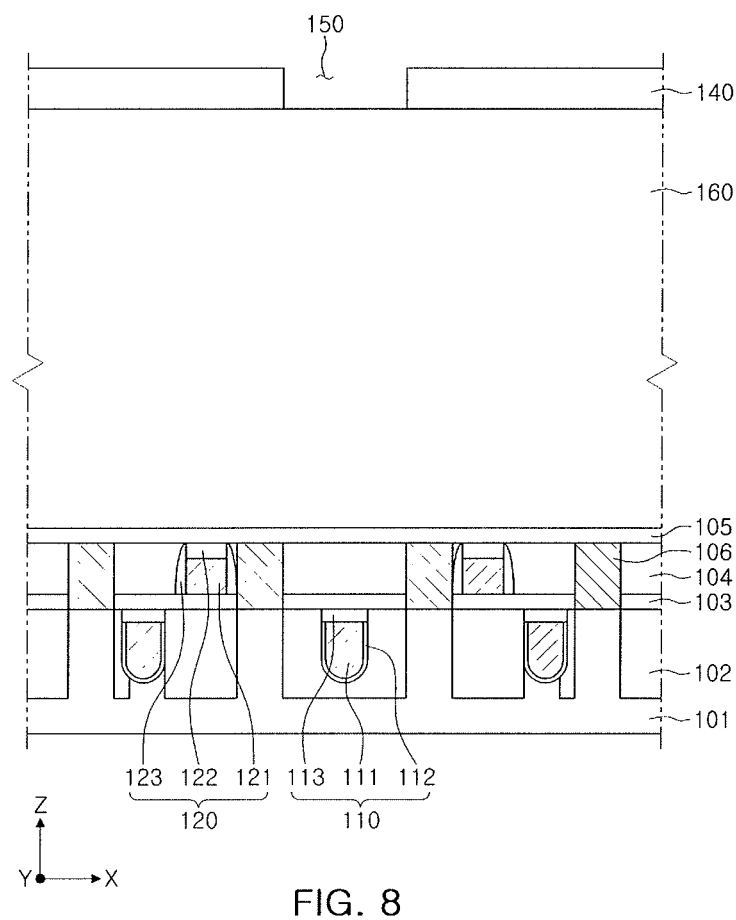

With reference to FIG. 7, a mask layer M1 for patterning the preliminary support layer 140A may be formed on the preliminary support layer 140A. The mask layer M1 may be a photoresist pattern, and may have a pattern corresponding to the opening 150, illustrated in FIGS. 1 to 4. A portion of the preliminary support layer 140A, exposed by the mask layer M1, is removed to form the opening 150, as illustrated in FIG. 8. The preliminary support layer 140A may be defined as the support layer 140 after the opening 150 is formed.

Figure 9:
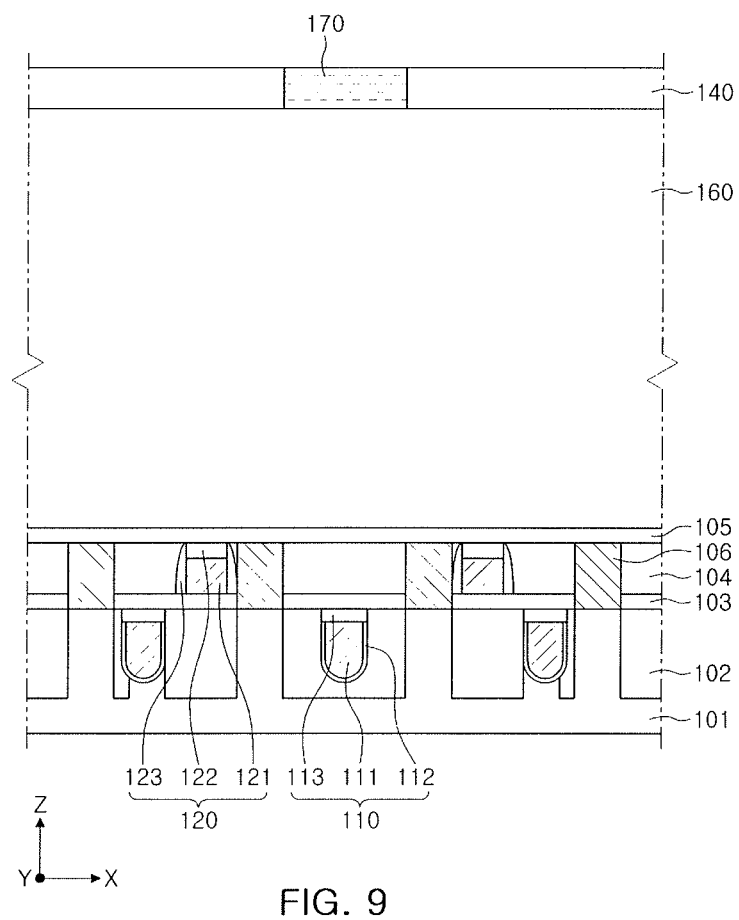

With reference to FIG. 9, a sacrificial layer 170 may be formed by filling the opening 150 with a predetermined material. A material for formation of the sacrificial layer 170 is deposited on the support layer 140, and a planarization process, e.g., chemical mechanical planarization (CMP) or the like, is performed to form the sacrificial layer 170, as illustrated in FIG. 9. The sacrificial layer 170 may include a different material from each of the molding layer 160 and the support layer 140, but may have etching characteristics similar to those of the material of the support layer 140. In an example embodiment, when the molding layer 160 includes, e.g., a silicon oxide, and the support layer 140 includes, e.g., a silicon nitride or a silicon carbon nitride, the sacrificial layer 170 may be formed of a different material from materials described above. In an example embodiment, the sacrificial layer 170 may be formed of, e.g., a silicon oxynitride.

Figure 10:
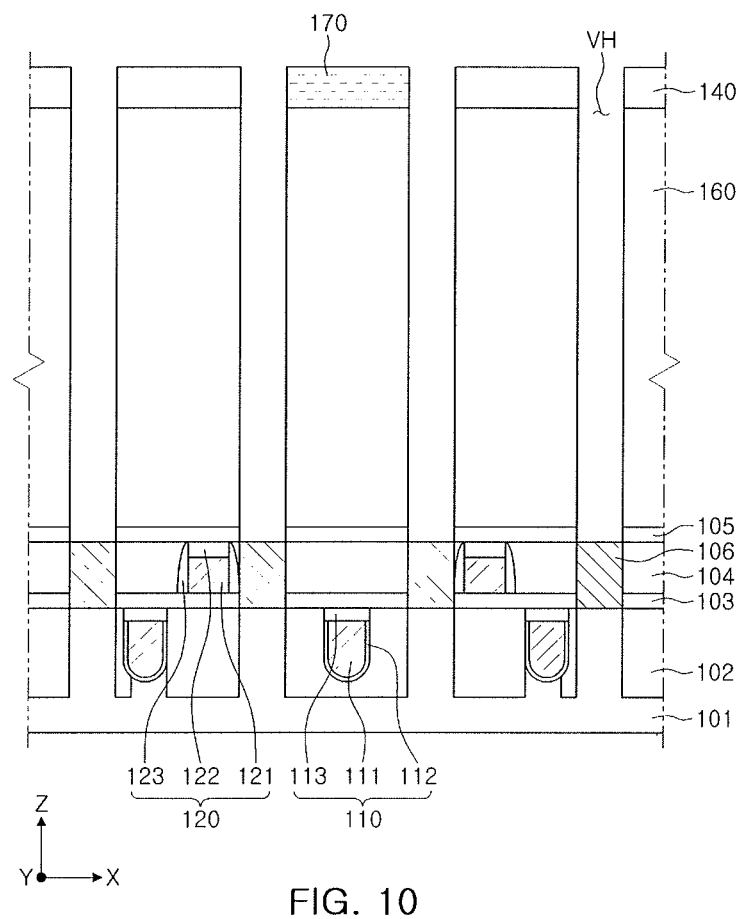

With reference to FIG. 10, the molding layer 160, the support layer 140, and the sacrificial layer 170 are selectively etched to form the plurality of vertical holes VH. The plurality of vertical holes VH may pass through the support layer 140, the molding layer 160, and the etch stop layer 105 to expose an upper surface of the contact pad 106. The vertical capacitor 130 may be formed in the plurality of vertical holes VH in a subsequent process. In other words, an arrangement of the plurality of vertical holes VH may correspond to an arrangement of the vertical capacitors 130 in the plan view illustrated in FIG. 1.

In detail, the plurality of vertical holes VH may be formed by a dry etching process, and at least a portion of the plurality of vertical holes VH may pass through a boundary between the sacrificial layer 170 and the support layer 140. As the sacrificial layer 170 is formed of a different material than each of the molding layer 160 and the support layer 140, while having etching characteristics similar to those of the support layer 140, the vertical holes VH at boundaries between the sacrificial layer 170 and the support layer 140 are formed to have a symmetrical shape.

If a difference in etching characteristics between the sacrificial layer 170 and the support layer 140 were to be large, a vertical hole passing through a boundary between the sacrificial layer 170 and the support layer 140 could be formed to have an asymmetrical structure. For example, if the sacrificial layer 170 were to be formed of a silicon oxide, i.e., the same as that used for the molding layer 160, and the support layer 140 were to be formed of a silicon nitride, the sacrificial layer 170 could be easily removed together with the molding layer 160 in a subsequent process, while the sacrificial layer 170 could be slowly etched as compared to the support layer 140, to form a vertical hole with an asymmetrical shape, e.g., a portion of a vertical hole in the support layer 140 could be more etched than a portion of a same vertical hole in the more-slowly etched sacrificial layer 170.

In contrast, according to an example embodiment, the difference in etching characteristics between the sacrificial layer 170 and the support layer 140 is minimized, thereby providing vertical holes VH with symmetrical shapes at the boundary between the sacrificial layer 170 and the support layer 140. That is, the sacrificial layer 170 may be formed of a different material than each of the molding layer 160 and the support layer 140. Further, in the process of forming the vertical hole VH, the sacrificial layer 170 may have etching characteristics similar to those of the support layer 140, and thus, the vertical hole VH may be formed to have a symmetrical shape.

In an example embodiment, the sacrificial layer 170 may be formed of a silicon oxynitride. In a process in which the sacrificial layer 170 is formed of a silicon oxynitride, ammonia may be used as a source gas for supplying nitrogen. In this case, an amount of ammonia is appropriately adjusted to adjust a concentration of oxygen and nitrogen included in the sacrificial layer 170, and thus, etching characteristics of the sacrificial layer 170 may be determined therefrom. For example, during formation of the sacrificial layer 170 of silicon oxynitride, the concentrations of oxygen and nitrogen may be adjusted to form the sacrificial layer 170 with etching characteristics substantially similar to those of the support layer 140 when forming the vertical hole VH via dry etching (i.e., to reduce a difference in etching rates therebetween), and with etching characteristics similar to those of the molding layer 160, e.g., in a subsequent mold layer-removing process to remove the sacrificial layer 170 and the molding layer 160 in a single process.

Figure 11:
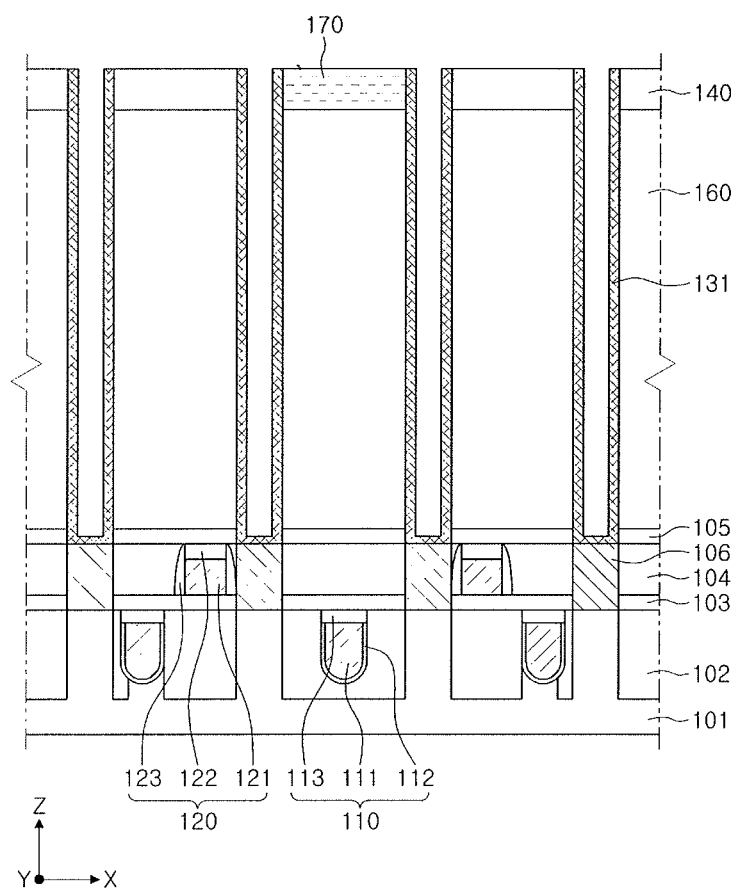

With reference to FIG. 11, the lower electrode 131 may be formed within the vertical hole VH. The lower electrode 131 may be formed of, e.g., a metal, a metal nitride, a metal oxide, doped polysilicon or the like, and may be formed on a lateral surface and a bottom surface inside the vertical hole VH to have a cylindrical shape. In another example embodiment, the lower electrode 131 may have a columnar shape filling the vertical hole VH.

Figure 12:
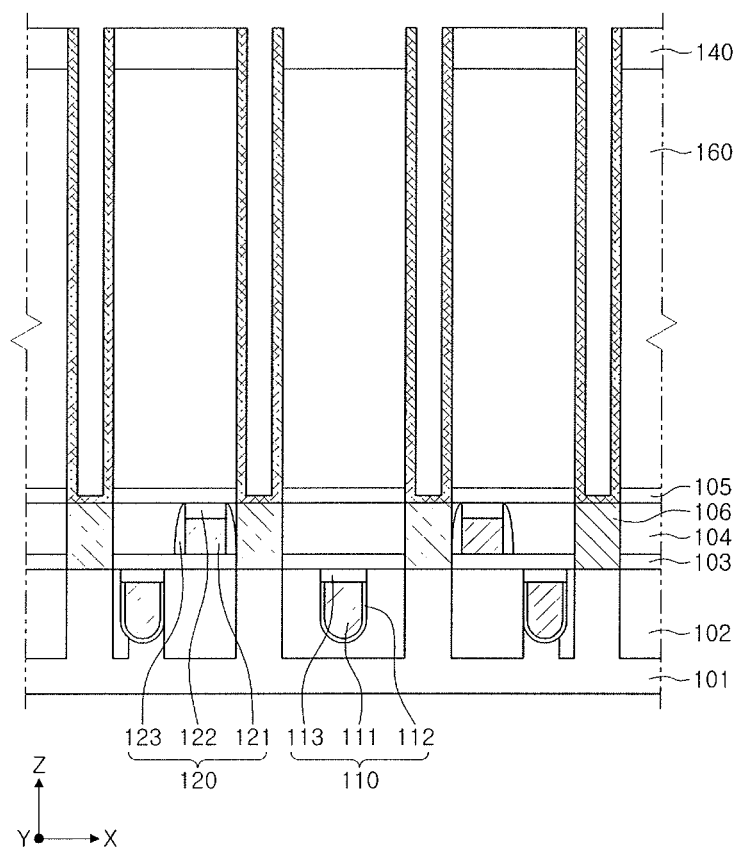
Figure 13:
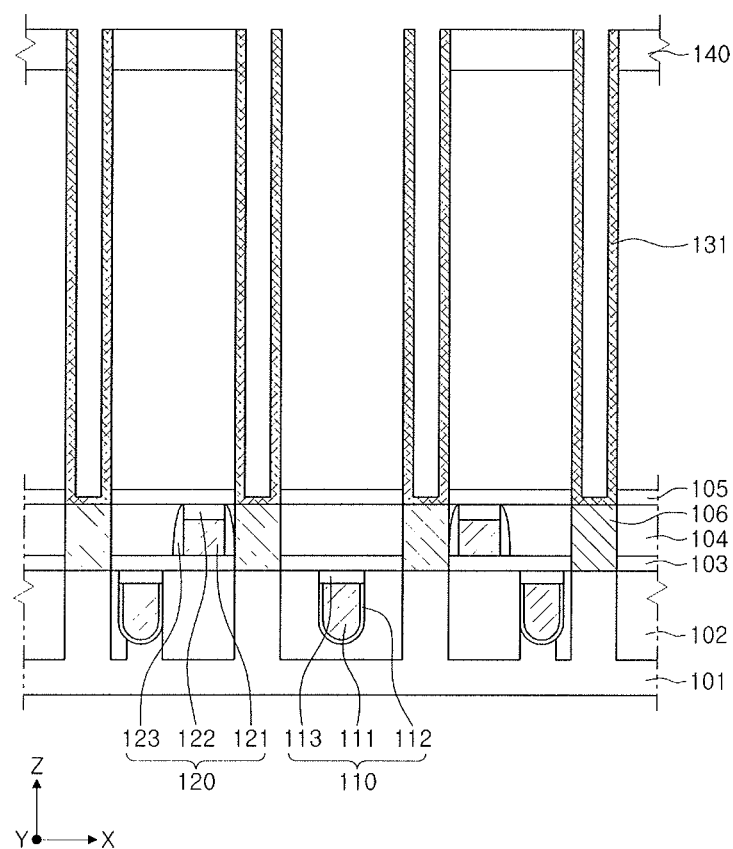

With reference to FIG. 12, the sacrificial layer 170 may be removed. The sacrificial layer 170 may be removed in a strip process using a phosphoric acid solution or the like. After the sacrificial layer 170 is removed, the molding layer 160 may be removed, as illustrated in FIG. 13. The molding layer 160 may be removed in a strip process, i.e., a wet etching process or the like. When the molding layer 160 is removed, the lower electrode 131 is exposed outwards, and the lower electrode 131 may be prevented from being tilted, collapsing or the like, due to the support layer 140 disposed between lower electrodes 131.

Figure 14:
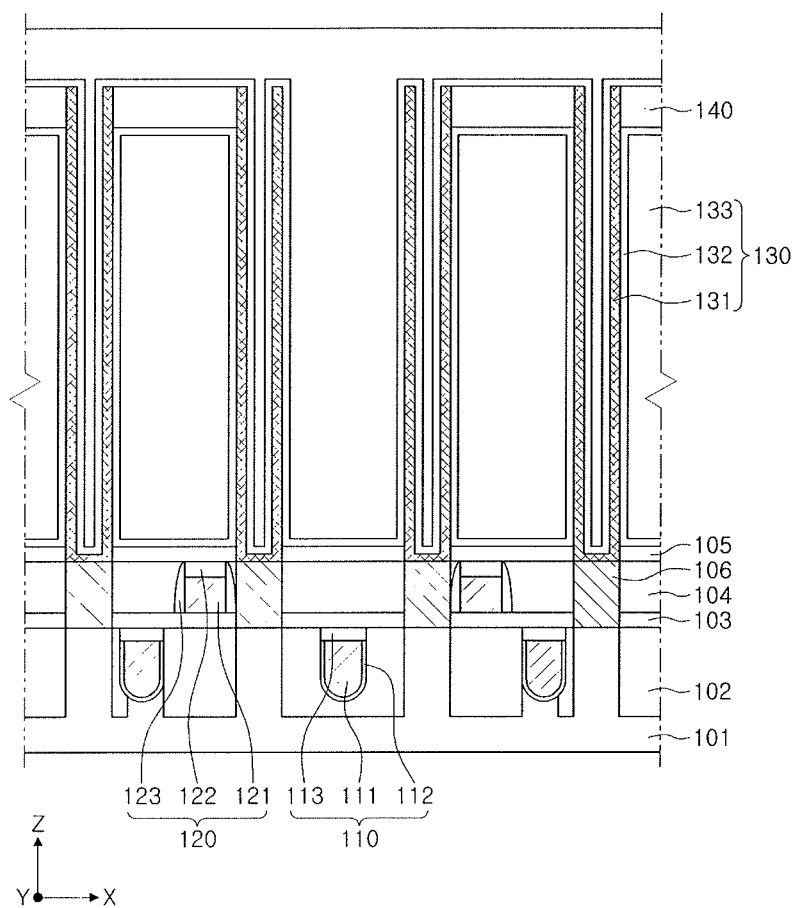

With reference to FIG. 14, the dielectric layer 132 and the upper electrode 133 may be formed on the lower electrode 131 to form the vertical capacitor 130. The dielectric layer 132 may include a high dielectric constant material, and may have a shape covering a surface of the lower electrode 131. With reference to FIG. 14, the dielectric layer 132 may also be formed on an inner lateral surface of the lower electrode 131, and the dielectric layer 132 may conform to a cylindrical shape of the lower electrode 131. The upper electrode 133 may be formed of, e.g., a metal, a metal oxide, a metal nitride, doped polysilicon or the like, and a space from which the molding layer 160 and the sacrificial layer 170 are removed may be filled with the upper electrode 133.

FIGS. 15 to 21 are drawings provided to describe a method of manufacturing a semiconductor device according to an example embodiment. In an example embodiment, a manufacturing method illustrated in FIGS. 15 to 21 may be applied to the semiconductor device 200, according to an example embodiment illustrated in FIG. 5.

Figure 15:
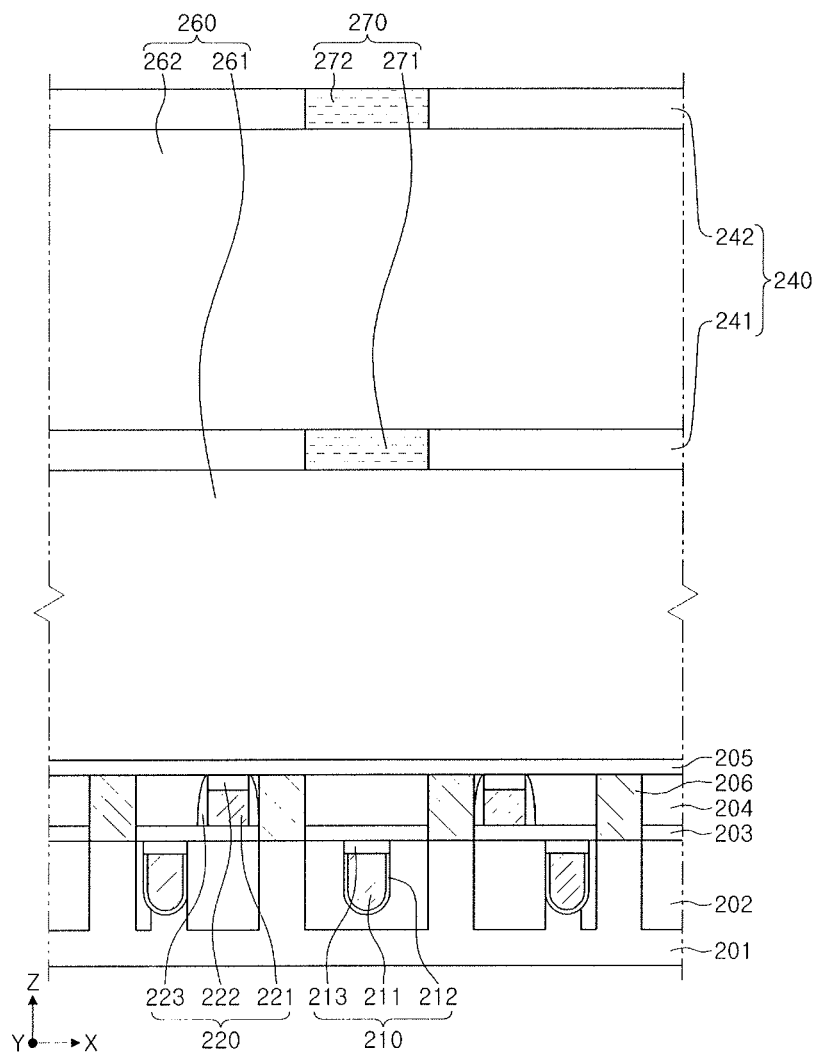
FIGS. 15 to 21 illustrate cross-sections of stages in a method of manufacturing a semiconductor device according to an example embodiment.

With reference to FIG. 15, a device isolation film 202 may be formed in an upper portion of the substrate 201, and the gate structure 210 including the gate electrode 211, the gate insulating layer 212, the capping layer 213, and the like may be embedded in the device isolation film 202. The cell blocking layer 203 may be formed on the substrate 201 and the device isolation film 202, while the bit line structure 220 including the bit line 221, the mask layer 222, the spacers 223, and the like may be formed above the cell blocking layer 203.

The bit line structure 220 may be embedded in the interlayer insulating film 204, and the etch stop layer 205 may be formed above the interlayer insulating film 204. The contact pad 206, in addition to the bit line structure 220, may be formed within the interlayer insulating film 204, and the contact pad 206 may be electrically connected to an active region of the substrate 201.

A plurality of molding layers 260, a plurality of support layers 240, and a plurality of sacrificial layers 270 may be formed above the etch stop layer 205. The plurality of molding layers 260 may include a first molding layer 261 and a second molding layer 262, and the plurality of support layers 240 may include the first support layer 241 and the second support layer 242. The plurality of sacrificial layers 270 may include a first sacrificial layer 271 and a second sacrificial layer 272 formed on openings of the first support layer 241 and the second support layer 242, respectively.

The first sacrificial layer 271 and the second sacrificial layer 272 may be formed in different positions in a direction perpendicular to an upper surface of the substrate 201 (a Z-axis direction in FIG. 15), and may be formed in the same position in directions parallel to the upper surface of the substrate 201 (X-axis and Y-axis directions in FIG. 15). Thus, when a structure, according to an example embodiment illustrated in FIG. 15, is viewed in the Z-axis direction, the first sacrificial layer 271 and the second sacrificial layer 272 may overlap each other.

Figure 16:
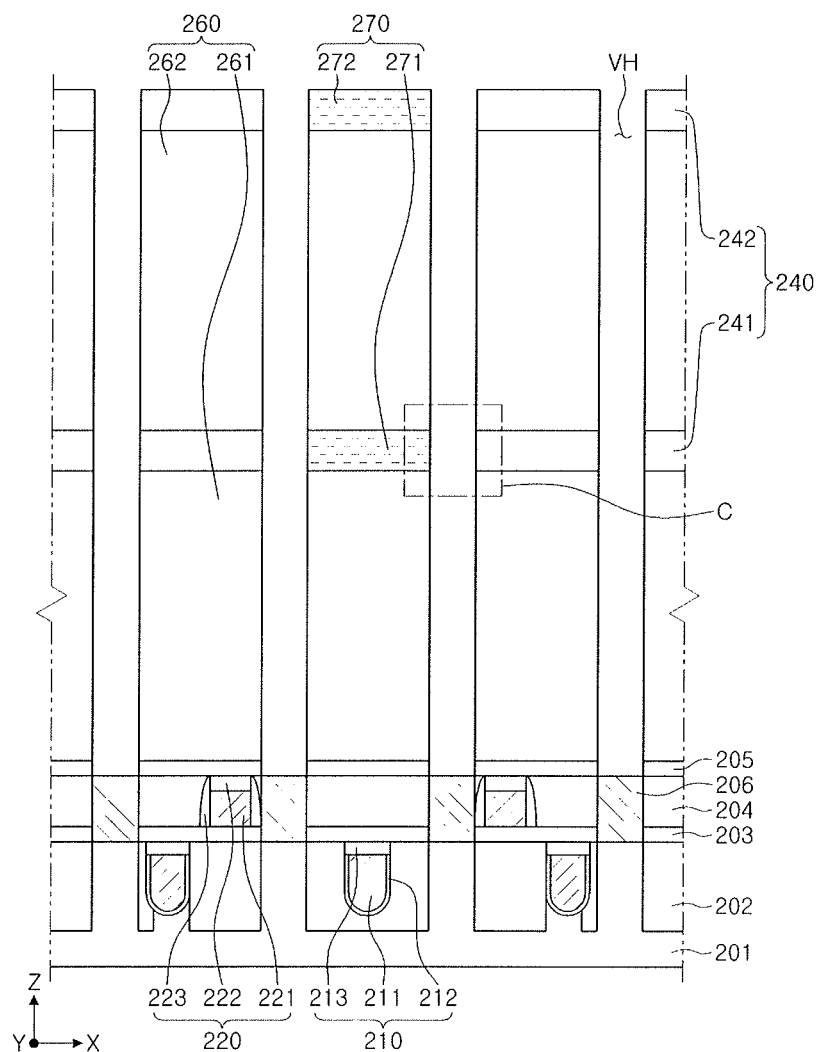

With reference to FIG. 16, the plurality of vertical holes VH may be formed. The plurality of vertical holes VH formed using a dry etching process or the like may pass through the plurality of support layers 240 and the plurality of molding layers 260 to expose an upper surface of the contact pad 206. At least a portion of the plurality of vertical holes VH may pass through a boundary between the sacrificial layer 270 and the support layer 240.

As discussed previously, if a difference in etching characteristics between the sacrificial layer 270 and the support layer 240 were to be large, at least a portion of the plurality of vertical holes VH could have an asymmetrical shape. However, according to example embodiments, physical properties of the sacrificial layer 270 may be adjusted, and the sacrificial layer 270 may include a different material from that of the molding layer 260 and the support layer 240. In an example embodiment, the sacrificial layer 270 may include a silicon oxynitride, the molding layer 260 may be formed of a silicon oxide, and the support layer 240 may be formed of a silicon nitride or a silicon carbon nitride. In a process of forming the sacrificial layer 270, ammonia may be used as a source gas for supplying nitrogen. In addition, an amount of ammonia may be appropriately adjusted to significantly reduce a problem of asymmetry generated at the boundary between the sacrificial layer 270 and the support layer 240 when the vertical hole VH is formed.

Figure 17:
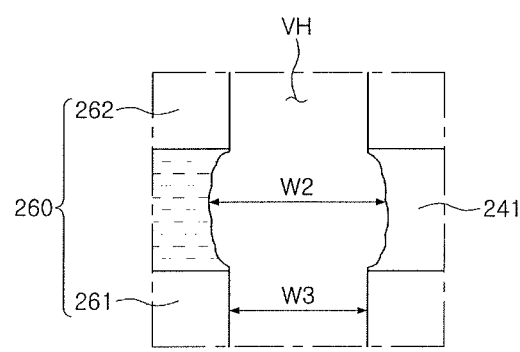

With reference to FIG. 17, in which portion C in FIG. 16 is enlarged, a width w2 of the vertical hole VH in a portion in which the sacrificial layer 270 and the support layer 240 are located may be greater than a width w3 of the vertical hole VH in a portion in which the molding layer 260 is located. The sacrificial layer 270 and the support layer 240 may have a higher etching rate than that of the molding layer 260 in a process of forming the vertical hole VH. Thus, the vertical hole VH may have a greater width in a portion in which the sacrificial layer 270 and the support layer 240 are provided than a width in a portion in which the molding layer 260 is located. The vertical hole VH having a shape illustrated in FIG. 17, may be present in a process according to another example embodiment, e.g., the structure illustrated in FIG. 10 or the like.

Figure 18:
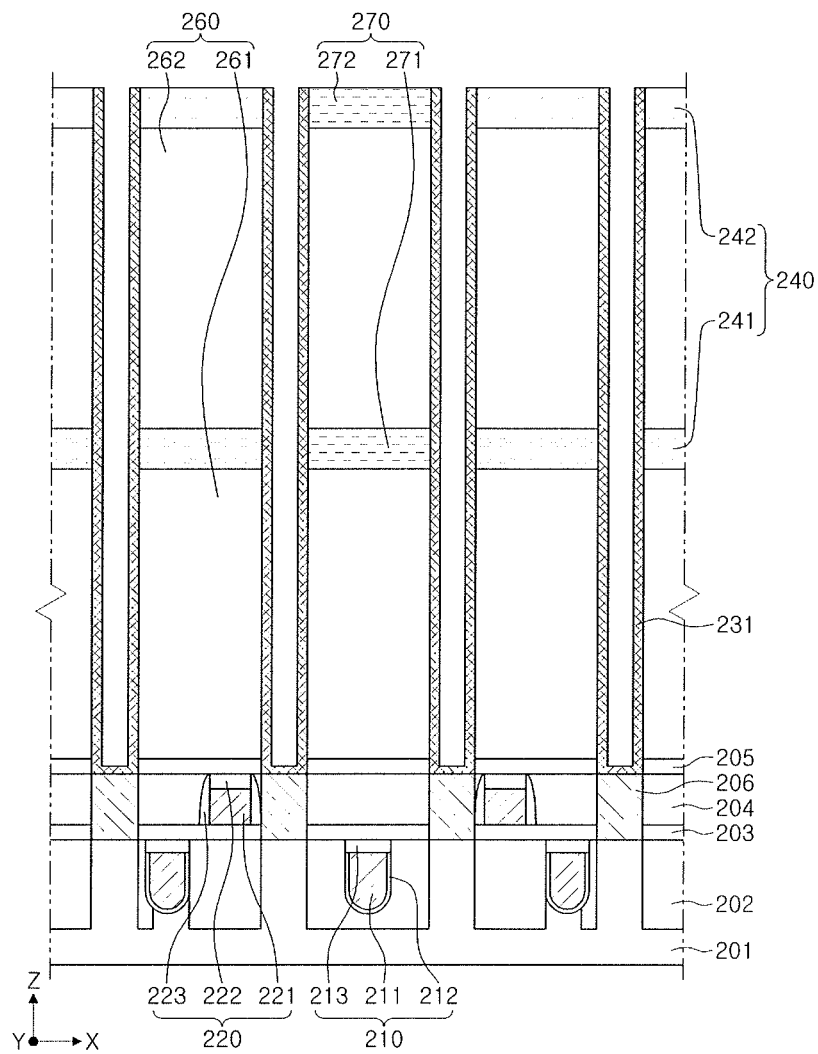

With reference to FIG. 18, a lower electrode 231 may be formed within the vertical hole VH. The lower electrode 231 may be formed of a conductive material. The lower electrode 231 may be formed in a process such as atomic layer deposition (ALD), chemical vapor deposition (CVD) or the like. The lower electrode 231 may have a greater width in a portion in which the sacrificial layer 270 and the support layer 240 are located than a width in a portion in which the molding layer 260 is located, in a manner similar to the vertical hole VH, according to an example embodiment illustrated in FIG. 17.

Figure 19:
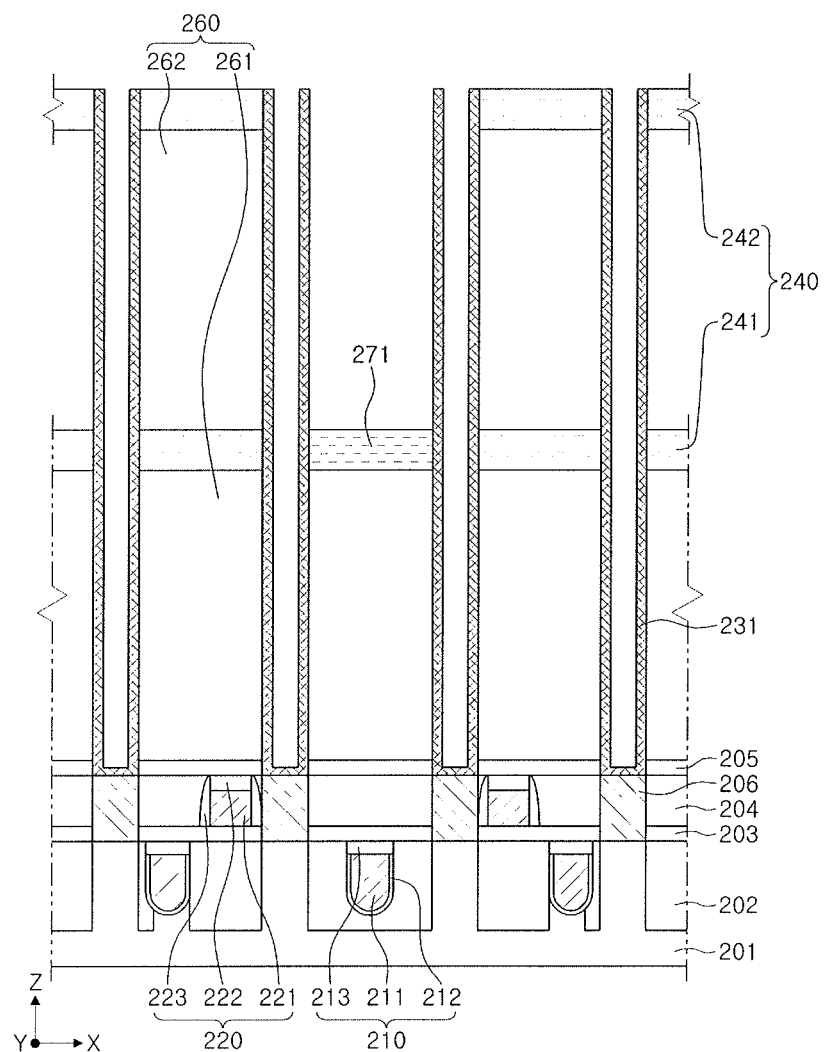
Figure 20:
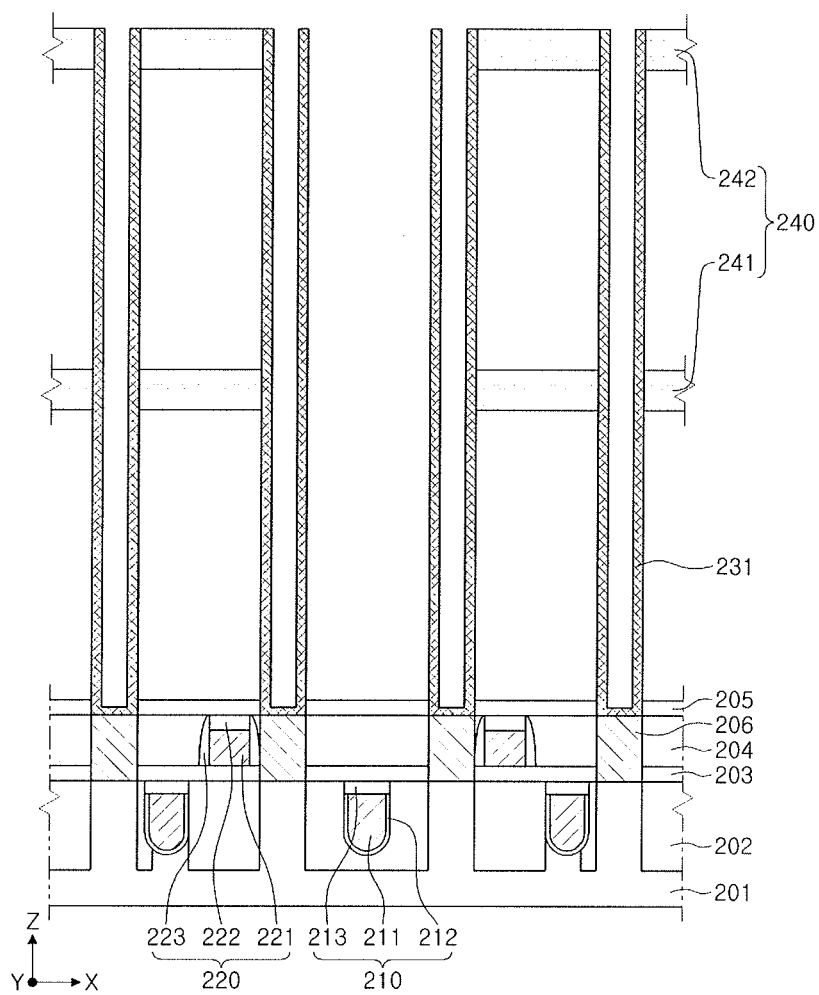

With reference to FIG. 19, after the lower electrode 231 is formed, the second sacrificial layer 272 and the second molding layer 262 located in a portion higher than the first sacrificial layer 271 and the first molding layer 261 may be removed. The second sacrificial layer 272 and the second molding layer 262 may be removed in a strip process or the like, and the lower electrode 231 may be exposed between the first support layer 241 and the second support layer 242. With reference to FIG. 20, the first sacrificial layer 271 and the first molding layer 261 in a portion lower than the second sacrificial layer 272 and the second molding layer 262 may be removed in a manner similar to the process in FIG. 19. The lower electrode 231 may not collapse or may not be tilted due to the first support layer 241 and the second support layer 242. On the other hand, the lower electrode 231 may have a columnar shape filling an inside of the vertical hole VH, in addition to a cylindrical shape illustrated in FIG. 20.

Figure 21:
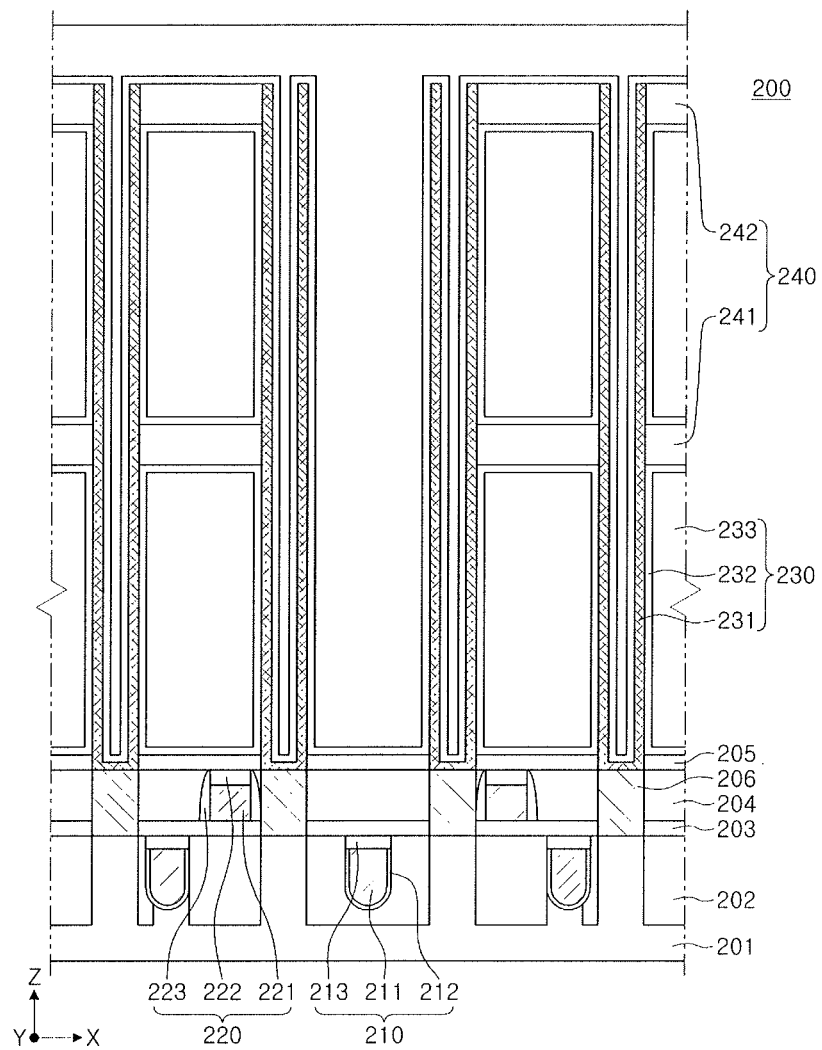

With reference to FIG. 21, a dielectric layer 232 and an upper electrode 233 may be funned outside the lower electrode 231. The dielectric layer 232 may be formed of a high dielectric constant material such as $ZrO_2$, $Al_2O_3$, $Hf_2O_3$ or the like, and the upper electrode 233 may be formed of a conductive material. The upper electrode 233 may be formed to fill all regions from which the molding layer 260 and the sacrificial layer 270 removed.

FIGS. 22 to 29 are drawings provided to describe a method of manufacturing a semiconductor device according to an example embodiment. In an example embodiment, a manufacturing method illustrated in FIGS. 22 to 29 may be applied to the semiconductor device 200, according to an example embodiment illustrated in FIG. 5.

Figure 22:
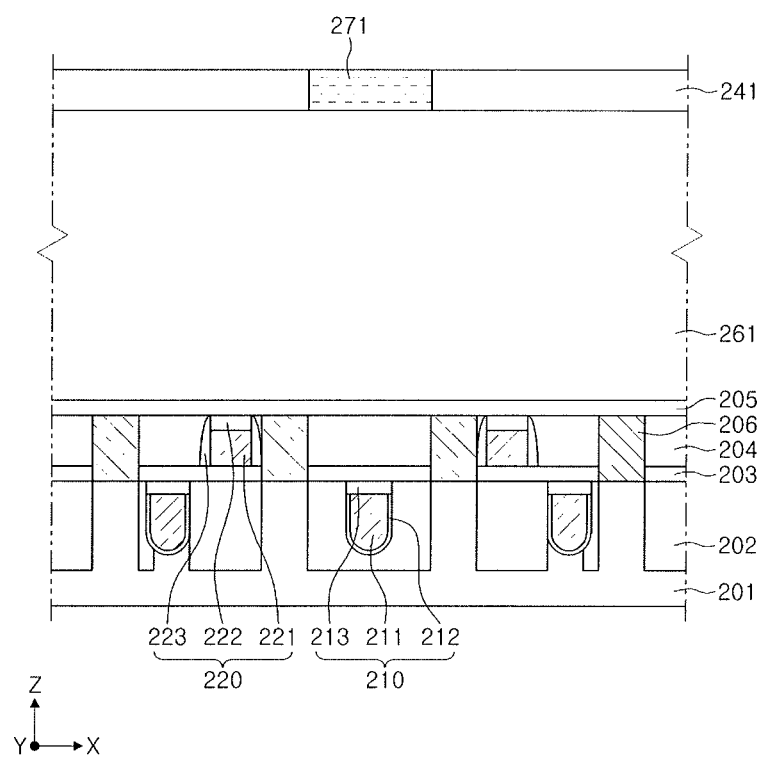
FIGS. 22 to 29 illustrate cross-sections of stages in a method of manufacturing a semiconductor device according to an example embodiment.

With reference to FIG. 22, the first molding layer 261, the first support layer 241, and the first sacrificial layer 271 may be formed above the etch stop layer 205. The first sacrificial layer 271 may be formed within a plurality of openings pre-patterned to be formed in the first support layer 241. The first molding layer 261 may be formed of a silicon oxide, and the first support layer 241 may be formed of a silicon carbon nitride or a silicon nitride. The first sacrificial layer 271 may be formed of a different material from that of the first molding layer 261 and the first support layer 241, for example, a silicon oxynitride. In an example embodiment, the first sacrificial layer 271 may have etching characteristics similar to those of the first support layer 241 in a dry etching process, and may have etching characteristics similar to those of the first molding layer 261 in a strip process.

Figure 23:
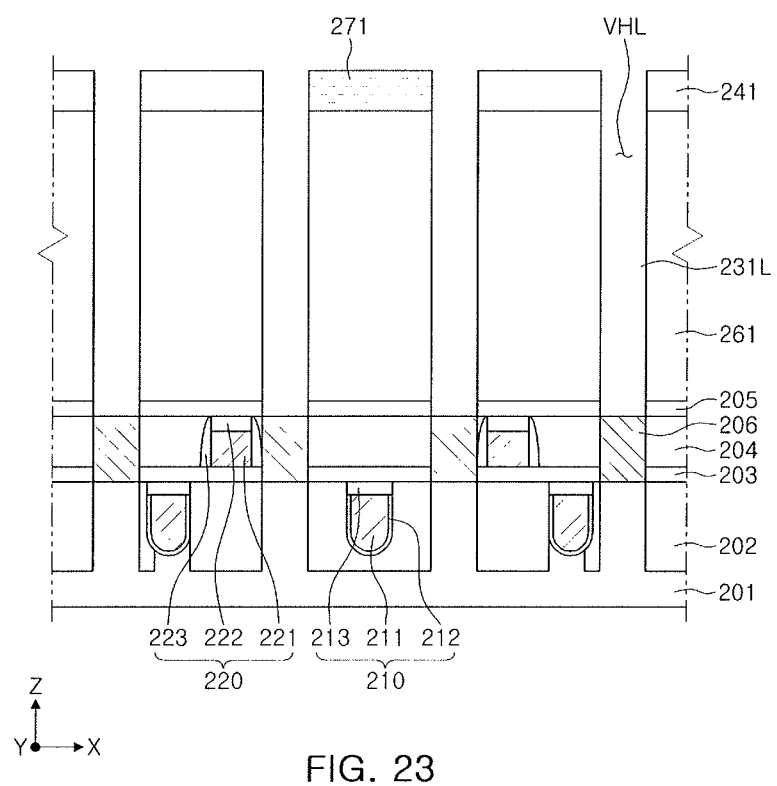

With reference to FIG. 23, a plurality of lower vertical holes VHL may be formed. A lower vertical hole VHL may be formed in a dry etching process, and may pass through the first molding layer 261 and the first support layer 241 to be extended to the contact pad 206. At least a portion of the plurality of lower vertical holes VHL may pass through a boundary between the first support layer 241 and the first sacrificial layer 271. In a dry etching process of forming the lower vertical hole VHL, the first sacrificial layer 271 may have etching characteristics similar to those of the first support layer 241. Thus, the lower vertical hole VHL may have a symmetrical structure even at the boundary between the first support layer 241 and the first sacrificial layer 271. The symmetrical structure refers to a structure where a distance to an inner lateral surface of the first support layer 241 and a distance to an inner lateral surface of the first sacrificial layer 271, based on a virtual central axis of the lower vertical hole VHL, are substantially the same.

Figure 24:
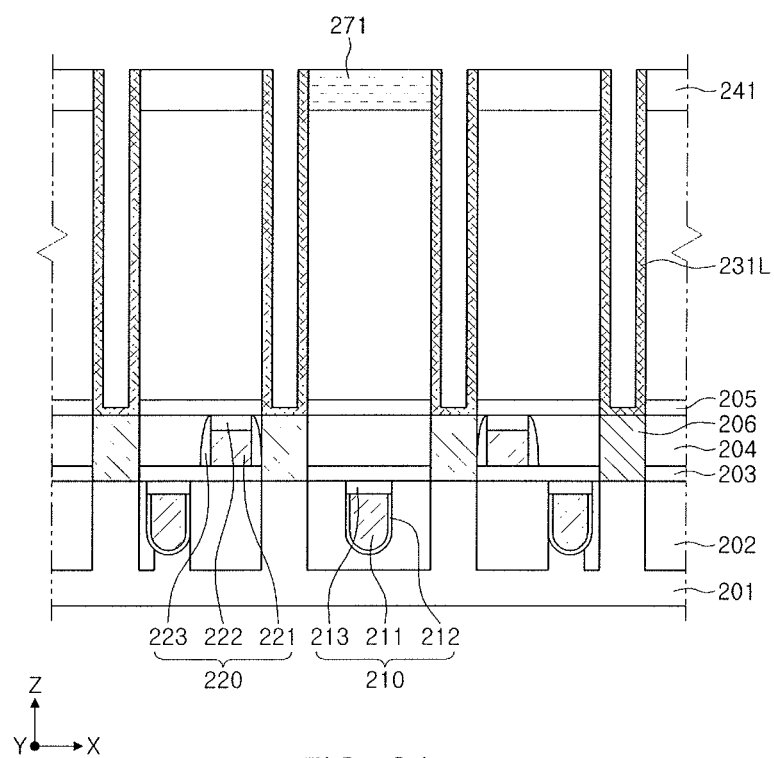

With reference to FIG. 24, a first lower electrode 231L may be formed within the lower vertical hole VHL. The first lower electrode 231L may have a cylindrical shape filling only a portion of an internal space of the lower vertical hole VHL, or a columnar shape filling all of the internal space of the lower vertical hole VHL, and may be formed of a conductive material such as doped polysilicon, a metal, a metal oxide or the like.

Figure 25:
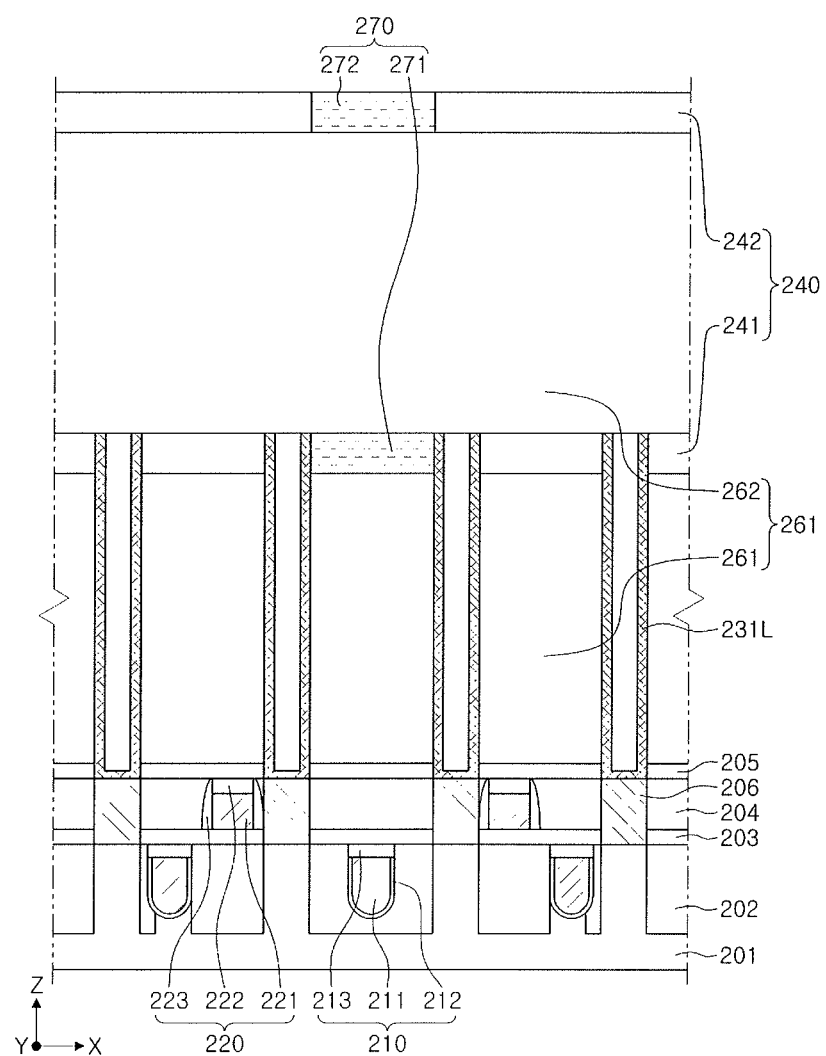

With reference to FIG. 25, the second molding layer 262, the second support. layer 242, and the second sacrificial layer 272 may be formed above the first support layer 241, the first sacrificial layer 271, and the first lower electrode 231L. The second sacrificial layer 272, in a manner similar to the first sacrificial layer 271, may be formed within a plurality of openings of the second support layer 242, which is pre-patterned. Material compositions of the second sacrificial layer 272, the second support layer 242, and the second molding layer 262 may be similar to those of the first sacrificial layer 271, the first support layer 241, and the first molding layer 261, described previously. The second sacrificial layer 272 may be formed in the same position as that of the first sacrificial layer 271 on a surface (an X-Y plane) parallel to an upper surface of the substrate 201. At least a portion of the second molding layer 262 may fill a portion of an internal space of the first lower electrode 231L.

Figure 26:
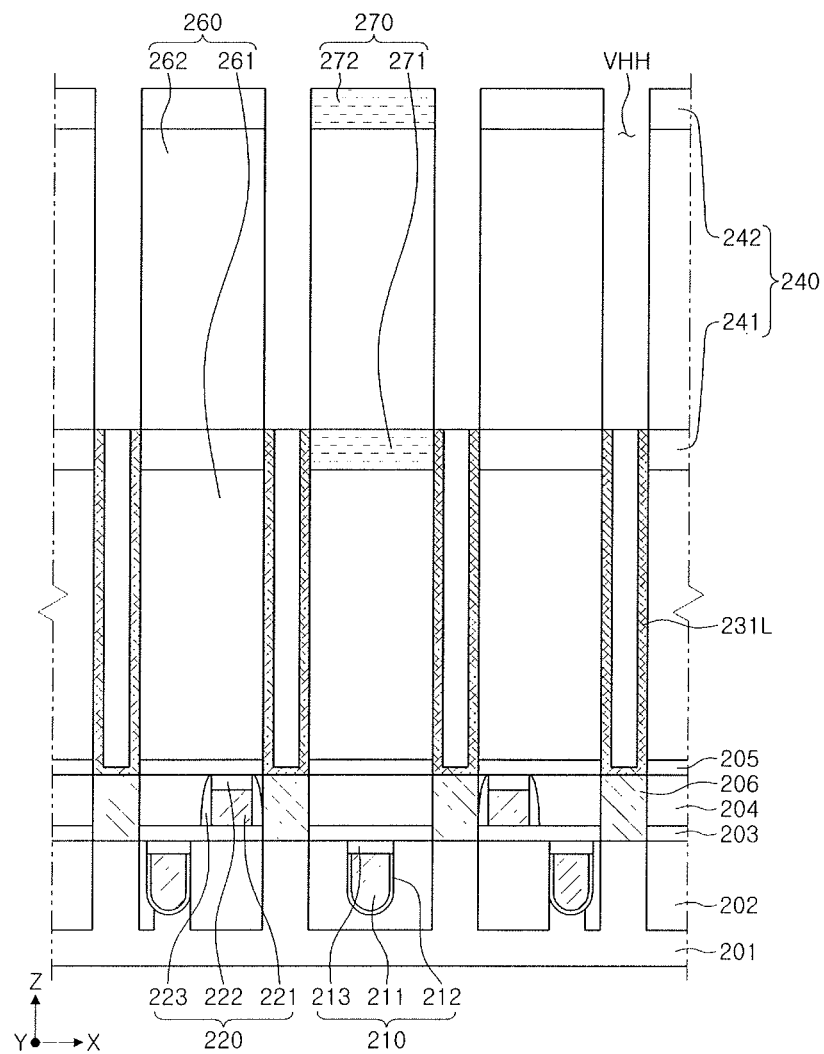

With reference to FIG. 26, a plurality of upper vertical holes VHH may be formed. An upper vertical hole VHH may be formed in a dry etching process or the like, in a manner similar to the lower vertical hole VHL, and at least a portion of the plurality of upper vertical holes VHH may pass through a boundary between the second sacrificial layer 272 and the second support layer 242. In a dry etching process, the second sacrificial layer 272 and the second support layer 242 may have etching characteristics similar to each other, and thus, the upper vertical hole VHH may have a symmetrical structure at the boundary between the second sacrificial layer 272 and the second support layer 242. The upper vertical hole VHH may be formed to a depth at which an upper surface of the first lower electrode 231L is exposed.

Figure 27:
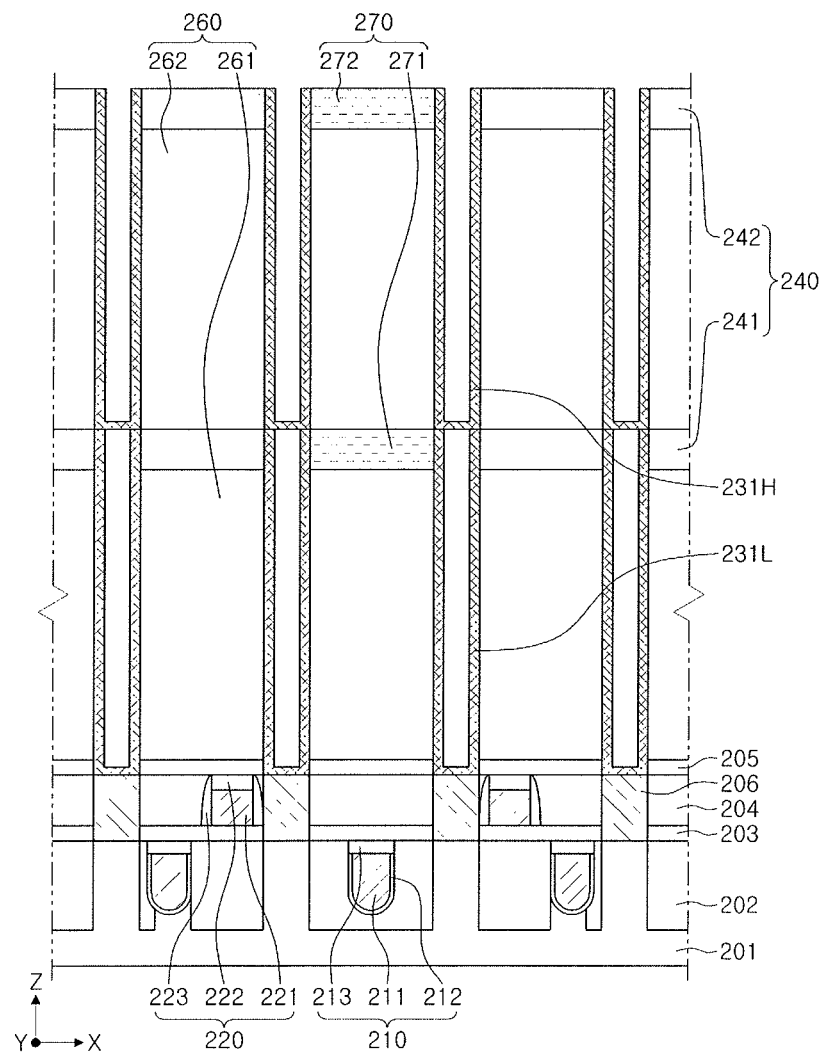
Figure 28:
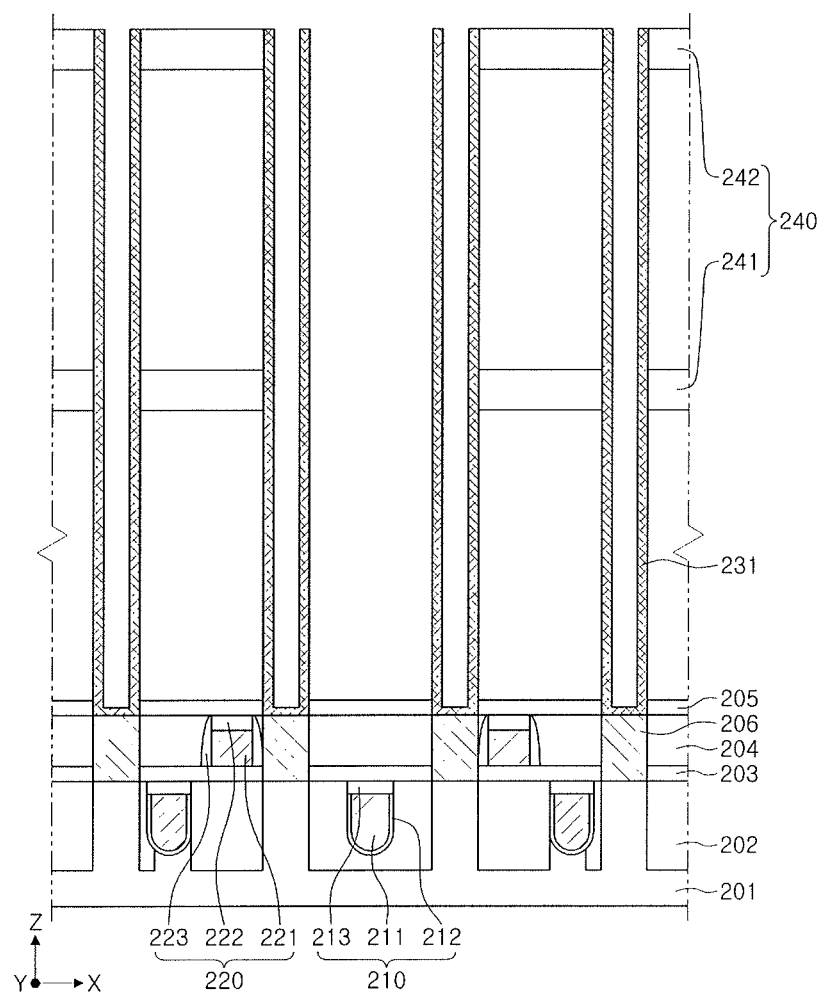

With reference to FIG. 27, a conductive material may form a second lower electrode 231H within the upper vertical hole VHH. The second lower electrode 231H may be connected to the first lower electrode 231L, and may have a cylindrical shape or a columnar shape. When the second lower electrode 231H is formed, a bottom surface of the second lower electrode 231H is removed to form the lower electrode 231, as illustrated in FIG. 28. When the first lower electrode 231L and the second lower electrode 231H both have a columnar shape, the above-described process of removing the bottom surface of the second lower electrode 231H may be omitted.

Figure 29:
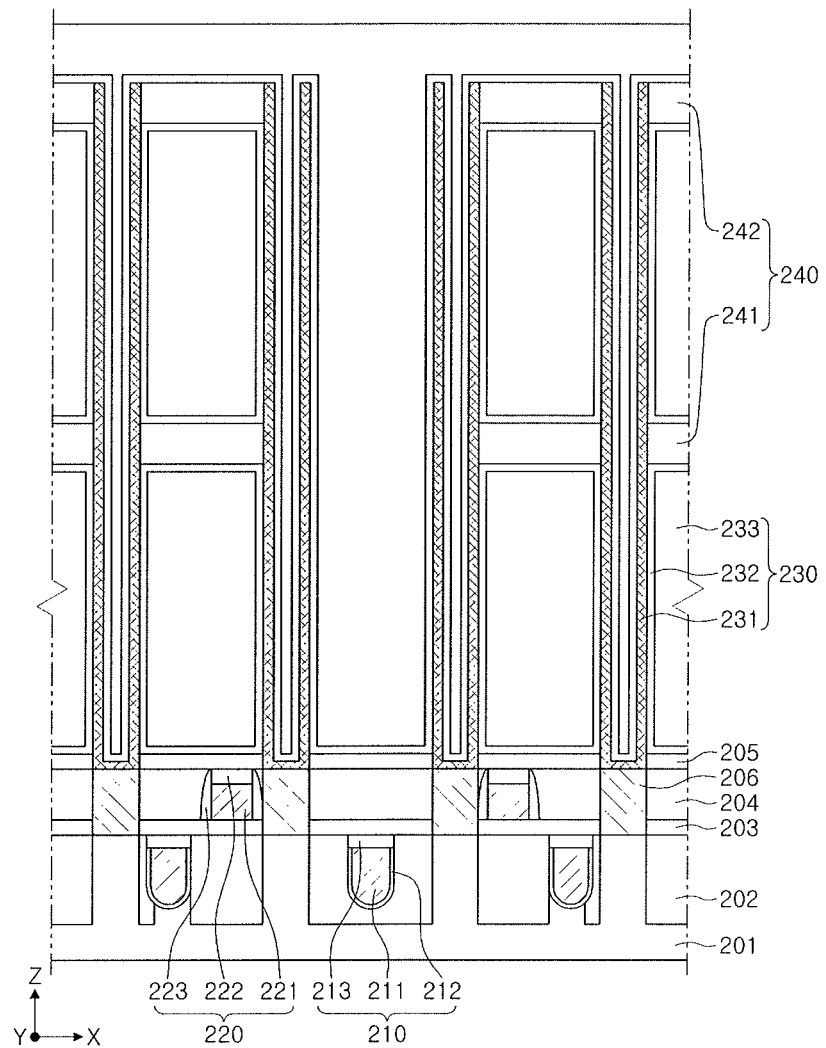

With reference to FIG. 28, the sacrificial layer 270 and the molding layer 260 may be removed. The sacrificial layer 270 and the molding layer 260 may be removed in a strip process, and the second sacrificial layer 272 and the second molding layer 262 located in a portion higher than the first sacrificial layer 271 and the first molding layer 261 may be removed in advance. In the strip process, the sacrificial layer 270 may have etching characteristics different from those of the support layer 240 and similar to those of the molding layer 260. With reference to FIG. 29, in a region from which the molding layer 260 and the sacrificial layer 270 are removed, the dielectric layer 232 and the upper electrode 233 may be formed to form the vertical capacitor 230. The upper electrode 233 may fill a space from which the molding layer 260 and the sacrificial layer 270 removed.

Figure 30:
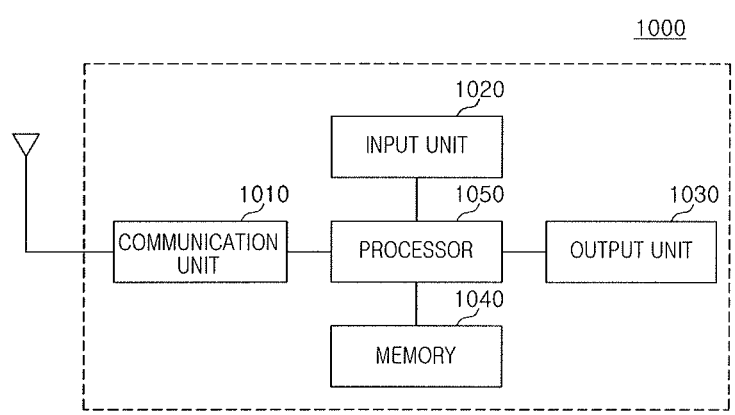
FIG. 30 illustrates a block diagram of an electronic device including a semiconductor device according to an example embodiment.

FIG. 30 is a block diagram illustrating an electronic device including a semiconductor device according to an example embodiment.

With reference to FIG. 30, an electronic device 1000, according to an example embodiment, may include a communications unit 1010, an input unit 1020, an output unit 1030, a memory 1040, and a processor 1050.

The communications unit 1010 may include a wired/wireless communications module, and may include a wireless Internet module, a local area communications module, a GPS module, a mobile communications module, and the like. The wired/wireless communications module included in the communications unit 1010 may be connected to an external communications network to transmit and receive data using various communications standards.

The input unit 1020 is a module provided to allow a user to control operations of the electronic device 1000, and may include a mechanical switch, a touch screen, a voice recognition module, and the like. In addition, the input unit 1020 may include a mouse operated in a manner of a trackball, a laser pointer or the like, or a finger mouse device, and may further include various sensor modules to allow a user to input data therewith.

The output unit 1030 may output information processed by the electronic device 1000 in the form of audio or video, and the memory 1040 may store a program for processing and controlling the processor 1050, data or the like therein. The memory 1040 may include one or more of the semiconductor devices 100 and 200, according to various example embodiments described previously, and the processor 1050 may transmit a command to the memory 1040, according to required operations, to thus store or retrieve data. The processor 1050 may also be implemented by the semiconductor devices 100, 200, and 300, according to an example embodiment described previously.

The memory 1040 may be embedded in the electronic device 1000 or may communicate with the processor 1050 through a separate interface. When the memory communicates with the processor 1050 through the separate interface, the processor 1050 may store or retrieve data in or from the memory 1040 through various interface standards such as SD, SDHC, SDXC, MICRO SD, USB, and the like.

The processor 1050 may control operations of respective portions included in the electronic device 1000. The processor 1050 may perform controlling and processing related to voice calls, video calls, data communications, and the like, or may perform controlling and processing to multimedia playback and management. In addition, the processor 1050 may process input transmitted through the input unit 1020 by a user, and may output a result thereof through the output unit 1030. In addition, as described above, the processor 1050 may store data required for controlling operations of the electronic device 1000 in the memory 1040, or may retrieve data required therefor from the memory 1040.

As set forth above, according to example embodiments, a method of manufacturing a semiconductor device may include forming a plurality of openings in a preliminary support layer and filling the plurality of openings with a different material from that of a molding layer and the preliminary support layer, to form a sacrificial layer. The sacrificial layer may have etching characteristics similar to those of the preliminary support layer in a vertical hole formation process, e.g., via dry etching, and may have etching characteristics similar to those of the molding layer in a molding layer removal process, e.g., via wet etching. Thus, a vertical hole having excellent symmetry may be formed without an increase in the number of steps required in a process to increase reliability of a capacitor. As such, embodiments provide a method of manufacturing a semiconductor device capable of preventing asymmetry, bending, or the like of a capacitor, which may be generated in the case that a support layer is used in a capacitor formation process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    stacking a molding layer and a preliminary support layer on a substrate;
    forming a support layer having a plurality of openings by removing at least a portion of the preliminary support layer;
    forming a sacrificial layer by filling the plurality of openings with a different material from a material of the molding layer and from a material of the preliminary support layer;
    forming a plurality of vertical holes through the support layer and through the molding layer;
    forming a lower electrode within the plurality of vertical holes; and
    removing the sacrificial layer and the molding layer.

2. The method of manufacturing a semiconductor device as claimed in claim 1, wherein forming the plurality of vertical holes includes forming at least a portion of the plurality of vertical holes at a boundary between the sacrificial layer and the support layer.

3. The method of manufacturing a semiconductor device as claimed in claim 1, wherein the molding layer is formed of a material having a predetermined etch selectivity with respect to the material of the support layer.

4. The method of manufacturing a semiconductor device as claimed in claim 1, wherein the sacrificial layer is formed of a material having a predetermined etch selectivity with respect to the material of the support layer.

5. The method of manufacturing a semiconductor device as claimed in claim 1, wherein the support layer is formed of at least one of a silicon nitride and a silicon carbon nitride, the sacrificial layer is formed of a silicon oxynitride, and the molding layer is formed of a silicon oxide.

6. The method of manufacturing a semiconductor device as claimed in claim 1, wherein the plurality of vertical holes are formed using a dry etching process.

7. The method of manufacturing a semiconductor device as claimed in claim 1, wherein the sacrificial layer and the molding layer are removed using a strip process.

8. The method of manufacturing a semiconductor device as claimed in claim 7, wherein the molding layer is removed by performing the strip process through a region from which the sacrificial layer is removed.

9. The method of manufacturing a semiconductor device as claimed in claim 1, wherein the lower electrode is formed to have a cylindrical shape.

10. The method of manufacturing a semiconductor device as claimed in claim 1, wherein the sacrificial layer is formed to have a plurality of regularly disposed regions.

11. The method of manufacturing a semiconductor device as claimed in claim 1, wherein an area of the sacrificial layer is smaller than an area of the support layer.

12. The method of manufacturing a semiconductor device as claimed in claim 1, wherein a thickness of the sacrificial layer is a same as a thickness of the support layer.

13. The method of manufacturing a semiconductor device as claimed in claim 1, wherein the molding layer is formed to be thicker than the support layer.

14. A method of manufacturing a semiconductor device, the method comprising:
    alternately stacking a plurality of support layers and a plurality of molding layers on a substrate, each of the support layers including a plurality of openings and a plurality of sacrificial layers within the plurality of openings;
    forming a plurality of vertical holes through the plurality of support layers and through the plurality of molding layers;
    forming a lower electrode within the plurality of vertical holes;

removing the plurality of sacrificial layers included in the plurality of support layers and the plurality of molding layers; and sequentially forming a dielectric layer and an upper electrode on the lower electrode layer.

15. The method of manufacturing a semiconductor device as claimed in claim 14, wherein the plurality of sacrificial layers included in different support layers of the plurality of support layers are formed to overlap each other.

16. A method of manufacturing a semiconductor device, the method comprising:

stacking a molding layer and a preliminary support layer on a substrate;

forming a support layer having a plurality of openings by removing at least a portion of the preliminary support layer;

forming a sacrificial layer by filling the plurality of openings in the support layer with a different material from a material of the molding layer and from a material of the preliminary support layer, dry etching rate of the materials of the sacrificial layer and of the support layer being similar;

forming a plurality of vertical holes through the support layer and through the molding layer by dry etching the support layer and the molding layer;

forming a lower electrode within the plurality of vertical holes; and removing the sacrificial layer and the molding layer.

17. The method of manufacturing a semiconductor device as claimed in claim 16, wherein forming the sacrificial layer in the support layer includes forming the sacrificial layer to completely fill the plurality of openings in the support layer, such that top surfaces of the sacrificial and support layers face a same direction and are level with each other, and bottom surfaces of the sacrificial and support layers face a same direction and are level with each other.

18. The method of manufacturing a semiconductor device as claimed in claim 17, wherein forming the plurality of vertical holes includes forming at least a portion of the plurality of vertical holes at a boundary between the sacrificial layer and the support layer, such that each vertical hole at the boundary between the sacrificial layer and the support layer penetrates both the sacrificial layer and the support layer.

19. The method of manufacturing a semiconductor device as claimed in claim 16, wherein forming the sacrificial layer includes using a material that has a same wet etching rate as that of the material of the molding layer.

20. The method of manufacturing a semiconductor device as claimed in claim 19, wherein dry etching the support layer and the molding layer to form the plurality of vertical holes is simultaneous, and a subsequent removal of the sacrificial layer and the molding layer via wet etching is simultaneous.

* * * * *